US007899100B2

(12) United States Patent
Kawakami et al.

(10) Patent No.: US 7,899,100 B2
(45) Date of Patent: Mar. 1, 2011

(54) GAN LASER ELEMENT

(75) Inventors: Toshiyuki Kawakami, Nara (JP); Tomoki Ono, Pittsburgh, PA (US)

(73) Assignee: Sharp Kabushiki Kaisha, Osaka (JP)

( * ) Notice: Subject to any disclaimer, the term of this patent is extended or adjusted under 35 U.S.C. 154(b) by 207 days.

(21) Appl. No.: 10/932,775

(22) Filed: Sep. 1, 2004

(65) Prior Publication Data
US 2005/0030995 A1 Feb. 10, 2005

Related U.S. Application Data

(63) Continuation of application No. PCT/JP03/01959, filed on Feb. 21, 2003.

(30) Foreign Application Priority Data

Mar. 1, 2002 (JP) .............................. 2002-055786

(51) Int. Cl.
H01S 5/00 (2006.01)
(52) U.S. Cl. ............... 372/43.01; 372/50.1; 372/50.124
(58) Field of Classification Search .............. 372/43.01, 372/50.1
See application file for complete search history.

(56) References Cited
U.S. PATENT DOCUMENTS

| 4,065,730 | A | * | 12/1977 | Minden .................... 372/46.01 |
| 4,405,236 | A | * | 9/1983 | Mitsuhashi et al. .......... 356/459 |
| 4,821,276 | A | * | 4/1989 | Alphonse et al. ......... 372/45.01 |
| 5,864,171 | A | | 1/1999 | Yamamoto et al. |
| 5,953,358 | A | * | 9/1999 | Ishikawa et al. ............ 372/50.1 |
| 6,456,429 | B1 | * | 9/2002 | Wu ............................ 359/344 |
| 6,519,272 | B1 | * | 2/2003 | Baliga et al. ............. 372/49.01 |
| 6,541,297 | B2 | * | 4/2003 | Takahashi ..................... 438/31 |
| 6,925,101 | B2 | * | 8/2005 | Matsumura .............. 372/46.01 |
| 7,072,373 | B2 | * | 7/2006 | Ohkubo et al. ........... 372/46.01 |
| 2001/0030328 | A1 | * | 10/2001 | Ishida ......................... 257/103 |
| 2001/0039104 | A1 | * | 11/2001 | Tsuda et al. ................. 438/496 |
| 2002/0037021 | A1 | * | 3/2002 | Ohkubo ........................ 372/46 |
| 2002/0048302 | A1 | * | 4/2002 | Kimura ........................ 372/46 |

(Continued)

FOREIGN PATENT DOCUMENTS

JP 64-025494 1/1989

(Continued)

OTHER PUBLICATIONS

Nagahama, S. et al. (Jul. 1, 2000). "High-Power and Long-Lifetime InGaN Multi-Quantum-Well Laser Diodes Grown on Low-Dislocation-Density GaN Substrates," *The Japan Society of Applied Physics* 39:L647-L650.

(Continued)

*Primary Examiner*—Minsun Harvey
*Assistant Examiner*—Delma R Forde
(74) *Attorney, Agent, or Firm*—Morrison & Foerster LLP

(57) ABSTRACT

In a GaN-based laser device having a GaN-based semiconductor stacked-layered structure including a light emitting layer, the semiconductor stacked-layered structure includes a ridge stripe structure causing a stripe-shaped waveguide, and has side surfaces opposite to each other to sandwich the stripe-shaped waveguide in its width direction therebetween. At least part of at least one of the side surfaces is processed to prevent the stripe-shaped waveguide from functioning as a Fabry-Perot resonator in the width direction.

3 Claims, 20 Drawing Sheets

U.S. PATENT DOCUMENTS

| | | | |
|---|---|---|---|
| 2002/0063258 A1 | 5/2002 | Motoki | |
| 2004/0041156 A1* | 3/2004 | Tsuda et al. | 257/79 |
| 2004/0233957 A1* | 11/2004 | Ito et al. | 372/46 |
| 2005/0170542 A1* | 8/2005 | Matsumura | 438/31 |
| 2005/0186694 A1* | 8/2005 | Takakura et al. | 438/28 |

FOREIGN PATENT DOCUMENTS

| | | | |
|---|---|---|---|
| JP | 03-116121 | | 5/1991 |
| JP | 03-293790 | | 12/1991 |
| JP | 05-145192 | * | 6/1993 |
| JP | 05-299778 | | 11/1993 |
| JP | 07-045906 | * | 2/1995 |
| JP | 08-018159 | | 1/1996 |
| JP | 08-330628 | | 12/1996 |
| JP | 11-17275 | | 1/1999 |
| JP | 11-74563 A | | 3/1999 |
| JP | 11-340507 | | 12/1999 |
| JP | 11-340576 A | | 12/1999 |
| JP | 2000-068593 A | | 3/2000 |
| JP | 2001-185802 A | | 7/2001 |

OTHER PUBLICATIONS

Nakamura, S. et al. (Mar. 15, 1998). "High-Power, Long-Lifetime InGaN/GaN/AlGaN-Based Laser Diodes Grown on Pure GaN Substrates," *Japanese Journal of Applied Physics* 37:L309-L312.

International Search Report mailed on May 27, 2003 for PCT Patent Application No. PCT/JP03/01959 filed on Feb. 21, 2003, two pages.

English translation of Office Action mailed Jun. 27, 2006, for JP Patent Application No. 055786/2002, four pages.

* cited by examiner

GAN LASER ELEMENT

CROSS-REFERENCE TO RELATED APPLICATIONS

This application is a continuation of International Application No. PCT/JP03/01959 filed on Feb. 21, 2003 which claims priority to Japanese Patent Application No. 2002-055786 filed on Mar. 1, 2002, the contents of each of which are incorporated herein by reference in their entirety.

TECHNICAL FIELD

The present invention relates to a GaN-based laser device of low noise that can be used suitably for a light source of optical information equipment or the like.

BACKGROUND ART

GaN-based compound semiconductors including the III group element(s) such as Al, Ga and In and the V group element of N have been expected as compound semiconductor materials for light emitting devices or power devices because of their favorable band structures and chemical stability, and application thereof has been attempted. In particular, as a light source for an optical information recording apparatus of next generation, production of a blue semiconductor laser device by stacking a plurality of GaN-based semiconductor layers on a sapphire substrate, for example, has been attempted vigorously.

An example of such a blue semiconductor laser device is shown in FIG. 20, wherein a refractive index difference is caused at the boundary of the ridge-type waveguide to thereby confine light within the waveguide for lasing (see, e.g., Jpn. J. Appl. Phys., Vol. 37 (1998), pp. L309-L312, and Jpn. J. Appl. Phys., Vol. 39 (2000), pp. L647-L650). In this conventional GaN-based laser 2000, a GaN thick film is formed on a (0001) plane sapphire substrate (not shown), followed by removal of the sapphire substrate. Stacked successively on the (0001) plane GaN thick film substrate 2001 are a Si-doped n-type GaN lower contact layer 2003, a Si-doped n-type $Al_{0.1}Ga_{0.9}N$ lower clad layer 2004, a Si-doped n-type GaN lower guide layer 2005, a multiple quantum well active layer 2006 utilizing $In_xGa_{1-x}N$ ($0 \leq x \leq 1$), a Mg-doped p-type $Al_{0.2}Ga_{0.8}N$ evaporation-preventing layer 2007, a Mg-doped p-type GaN upper guide layer 2008, a Mg-doped p-type $Al_{0.1}Ga_{0.9}N$ upper clad layer 2009, and a Mg-doped p-type GaN upper contact layer 2010.

At the top of semiconductor laser 2000, a linear ridge stripe 2011 is formed with a portion of upper clad layer 2009 and upper contact layer 2010. The ridge stripe serves to confine a horizontal transverse mode. A dielectric film 2012 of silicon oxide is formed on each side surface of ridge stripe 2011, which serves as a current-constricting layer for introducing electric current only from the top surface of the ridge stripe. The region delimited by the broken line represents the top portion of the ridge stripe in this figure as well as in the other figures.

A p-side electrode 2013 is formed to cover the top of ridge stripe 2011 and dielectric film 2012. Further, an n-side electrode 2014 is deposited on lower contact layer 2003 having been partially exposed by formation of a mesa 2015 having a side surface parallel to ridge stripe 2011. These electrodes serve to provide the power to semiconductor laser 2000.

Resonator end faces are formed by dry etching. The wafer is divided into bars not to break the end faces, and each bar is then divided parallel to the ridge stripe into chips, to thereby obtain GaN-based lasers 2000.

In semiconductor laser 2000, the light confinement is achieved by the stepped refractive index distribution by virtue of ridge stripe portion 2011, so that it is possible to obtain stable lasing of the horizontal transverse mode with a low threshold current. Furthermore, the lifetime of that laser device exceeds 10,000 hours, and thus it is considered the semiconductor laser technology has almost been completed in terms of the long life and accompanying reliability of the device.

The laser having the structure as shown in FIG. 20, however, is known to cause ripples in its emission spectrum. More specifically, in association with a minimum longitudinal mode interval (Fabry-Perot mode interval) $\lambda_0$ that is determined from the resonator length in the stripe direction, a plurality of modes occur at mode intervals $\lambda_1 = n\lambda_0$ (n is an integer). That is, only some modes among the possible Fabry-Perot modes actually occur.

It is known that a problem of noise arises when such a laser is used. A mode-hopping noise or the like occurs in the laser itself due to changes in environmental conditions. For example, when the oscillation wavelength shifts at random between the neighboring modes in a single-mode laser, intensity of the laser light varies depending on the difference in gain of the two modes, thereby causing noise. The difference in gain of the modes increases as the interval between the modes increases, and then the relative intensity noise (RIN) is also increased. When the mode intervals are very large, however, the shift of the mode is unlikely to occur, since the mode that can obtain the gain is restricted, in which case occurrence of the mode-hopping noise is suppressed. That is, RIN becomes very large when the difference in gain between the modes is relatively large but the interval therebetween is not large enough to suppress occurrence of the mode shift, compared to the case of mode-hopping at the minimum Fabry-Perot mode interval.

On the other hand, it is known that there is a problem of noise due to optical feedback when a semiconductor laser is used for a light source of an optical information recording apparatus. In particular, with a laser of high coherency such as a single-mode oscillation laser, RIN tends to increase considerably, and errors are likely to occur at the time of recording or reading information on an optical disk or the like. It is reported that the coherency and RIN of a GaAs-based laser or the like can be lowered by utilizing high-frequency modulation or self pulsation to cause longitudinal multi-mode oscillation and then such an improved laser is suitable for a light source of an optical information recording apparatus. With the GaN-based laser having strong mode selectivity as shown in FIG. 20, however, ripples are present on the spectrum, and thus it is difficult to lower the coherency and RIN even with high-frequency modulation or self pulsation.

DISCLOSURE OF THE INVENTION

In view of the above-described problems in the conventional GaN-based laser devices, an object of the present invention is to provide a GaN-based laser device reduced in noise.

According to the present invention, in the GaN-based laser device having a GaN-based semiconductor stacked-layered structure including a light emitting layer, the semiconductor stacked-layered structure includes a stripe-shaped waveguide structure formed therein and has side surfaces opposite to each other to sandwich the stripe-shaped waveguide in its width direction therebetween, and at least part of at least one of the side surfaces is processed to prevent the stripe-shaped waveguide from functioning as a Fabry-Perot resonator in the width direction.

For example, at least parts of the side surfaces sandwiching the stripe-shaped waveguide in its width direction therebetween may be tilted relative to each other to suppress the function as the Fabry-Perot resonator in the width direction.

In such a case, at least part of at least one of the side surfaces may be tilted with respect to a longitudinal direction of the stripe-shaped waveguide. The tilt angle is preferably within a range of more than 3 degrees and less than 25 degrees, and more preferably within a range of more than 10 degrees and less than 20 degrees.

Alternatively, at least part of at least one of the side surfaces sandwiching the stripe-shaped waveguide in its width direction therebetween may be tilted with respect to a plane orthogonal to the light emitting layer. The tilt angle is preferably within a range of more than 15 degrees and less than 90 degrees.

The method for forming the GaN-based laser device where at least part of at least one of the side surfaces sandwiching the stripe-shaped waveguide in its width direction therebetween is tilted with respect to the plane orthogonal to the light emitting layer may include: the step of forming, on the semiconductor stacked-layered structure, a resist layer pattern of an uneven thickness that is thinner in a portion over at least one end portion of the stripe-shaped waveguide in its width direction than in another portion over a central portion of the stripe-shaped waveguide in its width direction; and the step of dry-etching the semiconductor stacked-layered structure, while making the thinner end portion of the resist layer pattern retreat by the dry etching; to thereby form the side surfaces tilted with respect to the plane orthogonal to the light emitting layer. In this case, the resist layer pattern may be made to have the uneven thickness by utilizing at least one of cohesive effect and surface tension of the resist during heat treatment conducted after having formed the resist layer pattern to a substantially even thickness. Further, the thinned end portion of the resist layer pattern can be made to retreat by adding oxygen to an etching gas for the dry etching.

The method for forming the GaN-based laser device where at least part of at least one of the side surfaces sandwiching the stripe-shaped waveguide in its width direction therebetween is tilted with respect to the plane orthogonal to the light emitting layer may include: the step of forming a resist layer pattern on the semiconductor stacked-layered structure; and the step of dry-etching the semiconductor stacked-layered structure, using the resist layer pattern as a mask, to form the side surfaces tilted with respect to the plane orthogonal to the light emitting layer. In the step of forming the side surfaces, the dry etching may be performed under the condition that deposits are accumulated on the side surfaces during formation of the side surfaces, and the deposits can serve to cause the tilt angle of the side surfaces. In this case, a fluorine-containing gas may be added to an etching gas for the dry etching to make the deposits accumulate on the side surfaces during the etching.

At least part of at least one of the side surfaces sandwiching the stripe-shaped waveguide in its width direction therebetween may have surface roughness formed to suppress the function as the Fabry-Perot resonator in the width direction. It is preferable that the surface roughness substantially corresponds to more than a root-mean-square roughness value of 50 nm measured by an atomic force microscope.

At least part of at least one of the side surfaces sandwiching the stripe-shaped waveguide in its width direction therebetween may include a plurality of partial side surfaces tilted with respect to a longitudinal direction of the stripe-shaped waveguide. In this case, the tilt angle is preferably within a range of more than 3 degrees and less than 90 degrees.

An anti-reflection film may be formed on at least part of the side surfaces sandwiching the stripe-shaped waveguide in its width direction therebetween to suppress the function as the Fabry-Perot resonator in the width direction, and the anti-reflection film preferably includes a plurality of layers. Further, the anti-reflection film preferably has reflectivity of less than 10% in a wavelength range of 390-420 nm. The semiconductor stacked-layered structure may include a lower clad layer and an upper clad layer arranged below and above the light emitting layer, respectively, and the anti-reflection film is preferably formed to cover at least from a side end surface of the lower clad layer to a side end surface of the upper clad layer. The side surface provided with the anti-reflection film may be tilted with respect to the plane orthogonal to the light emitting layer. Further, the anti-reflection film may include different kinds of layers formed with materials selected from oxides, nitrides, sulfides and halogen compounds.

The at least part of the at least one of the side surfaces sandwiching the stripe-shaped waveguide in its width direction therebetween may include a curved surface. Further, the at least part of the at least one of the side surfaces may be a chip-division surface that has been created at the time of chip-division. Still further, the at least part of the at least one of the side surfaces sandwiching the stripe-shaped waveguide in its width direction therebetween may be a side surface of a mesa that has been formed by etching.

The method for forming the GaN-based laser device where an anti-reflection film is formed on at least part of the side surfaces sandwiching the stripe-shaped waveguide in its width direction therebetween to suppress the function as the Fabry-Perot resonator in the width direction may include the steps of forming the anti-reflection film on the at least part of the at least one of the side surfaces, and then carrying out chip-division to leave the anti-reflection film.

BEST MODES FOR CARRYING OUT THE INVENTION (Definitions of Terms)

Firstly, there are provided definitions of several terms used in the present specification.

Herein, the "GaN-based semiconductor" refers to a nitride-based compound semiconductor of a hexagonal crystal system including a compound of the III group element(s) with N of the V group element. It includes not only a material represented by the composition ratio of $Al_xGa_yIn_{1-x-y}N$ ($0 \leq x \leq 1$; $0 \leq y \leq 1$; $0 \leq x+y \leq 1$), but also a material with part (less than about 20%) of the III group element(s) replaced with another III group element (for example, B), a material with part (less than about 20%) of the V group element replaced with another V group element (for example, P or As), and a material containing a dopant (for example, Zn, Mg, Si, Ge, etc.) of less than about several %.

The "stripe-shaped waveguide" refers to a stripe-shaped region for confining and guiding light generated from a light-emitting portion.

The "stripe direction" refers to a direction (so-called "longitudinal direction") that is in parallel with the lengthwise direction of the stripe-shaped waveguide. The "upward" direction of the GaN-based laser device refers to the direction in which the GaN-based semiconductor layers are stacked on the substrate.

(Investigation Regarding Causes of Noises in a Laser Device)

Figure 20:
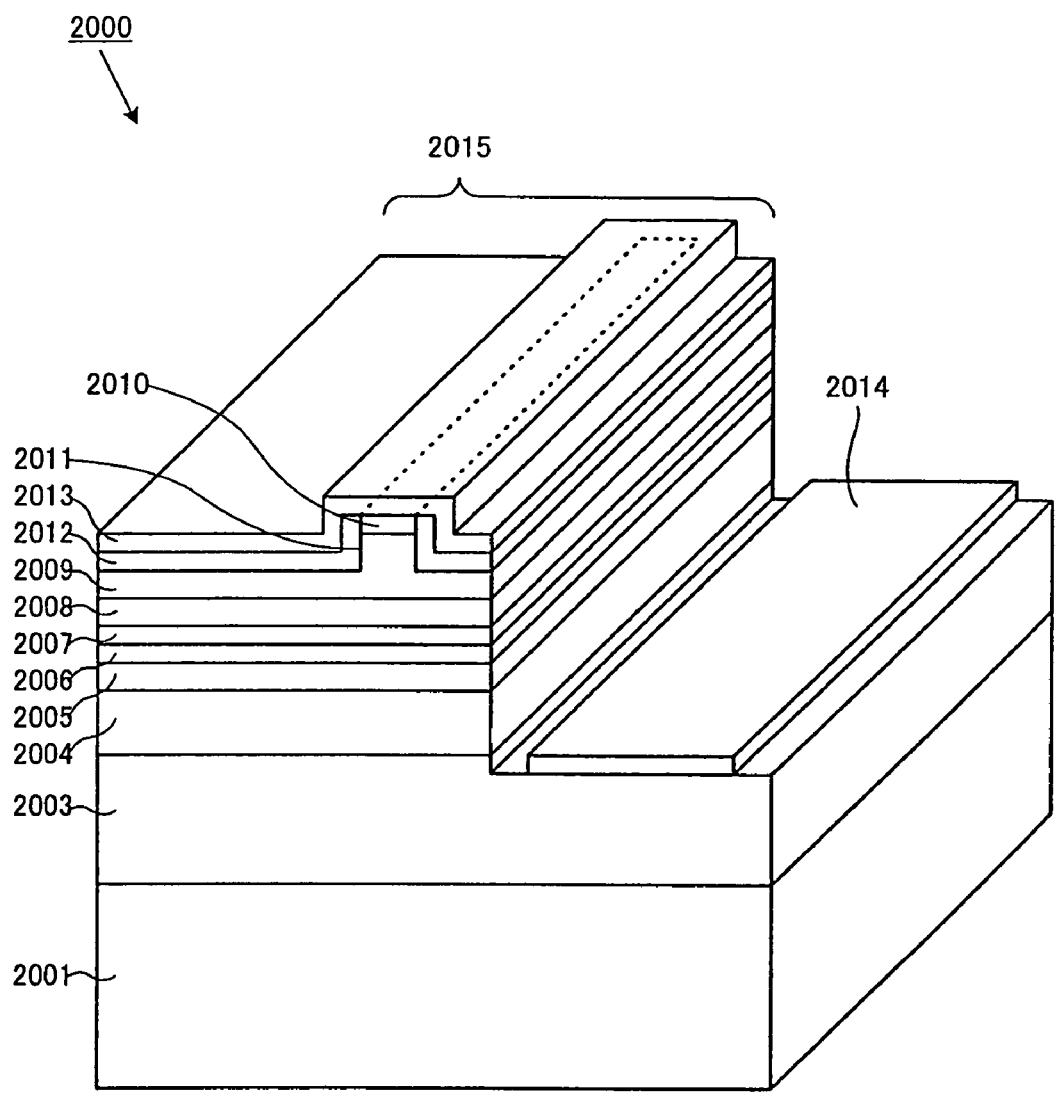
FIG. 20 is a schematic perspective view of a conventional GaN-based laser device.

To understand causes of noises in a conventional laser device more accurately, the inventors investigated reason why a laser device having a structure similar to that shown in FIG. 20 has strong mode selectivity and causes large noises.

Figure 3:
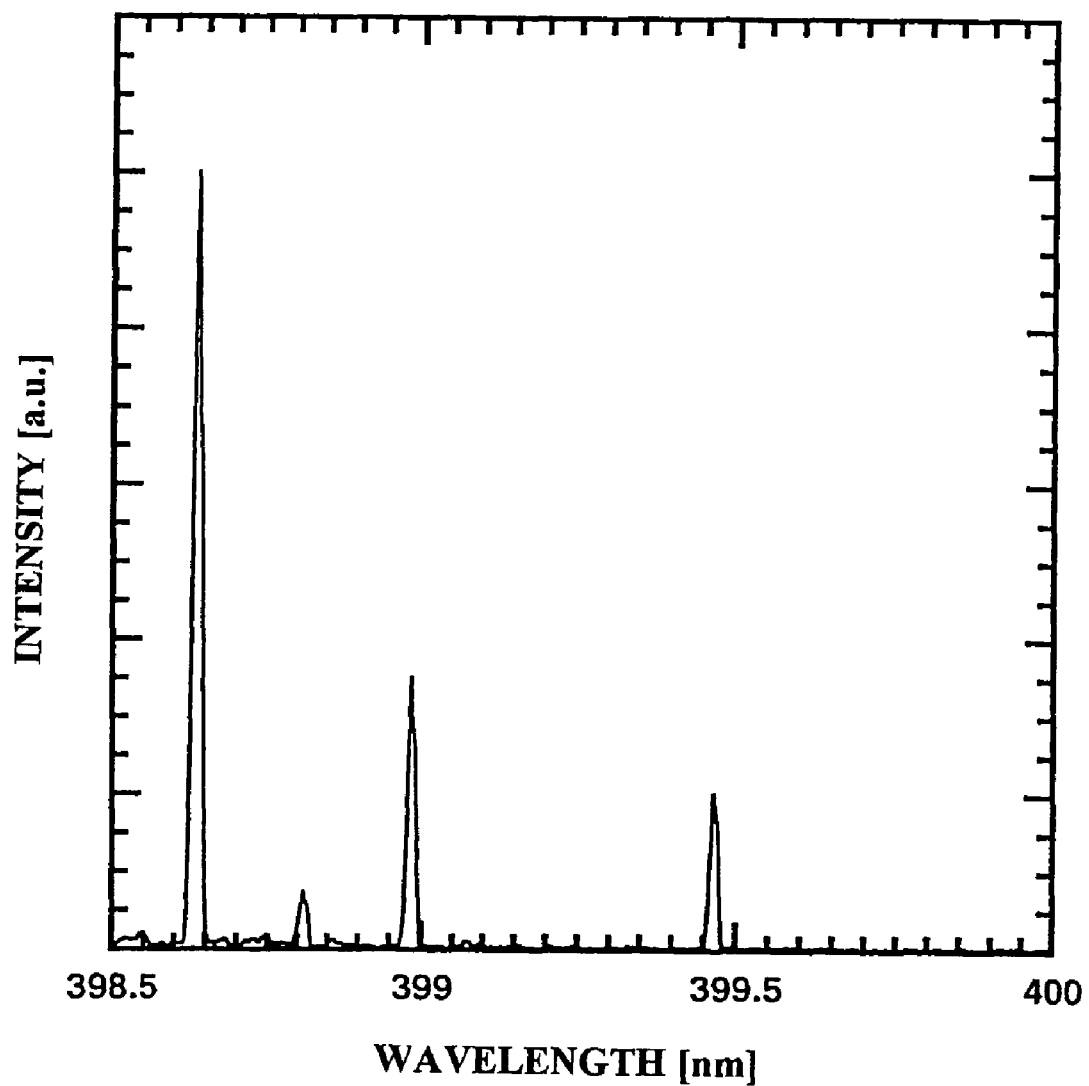
FIG. 3 is a graph illustrating emission spectrum distribution of a conventional GaN-based laser device.

Firstly, the emission spectrum of the GaN-based laser device was analyzed, and a graph of FIG. 3 was obtained. In the graph, the horizontal axis represents the wavelength (nm), and the vertical axis represents the laser light output intensity (a. u.: arbitrary unit). It is confirmed from FIG. 3 that this GaN-based laser device has a Fabry-Perot mode interval of about 0.05 nm, but a plurality of prominent modes occur at intervals of 0.3-0.5 nm each of which corresponds to several Fabry-Perot mode intervals, showing strong mode selectivity.

Figure 5:
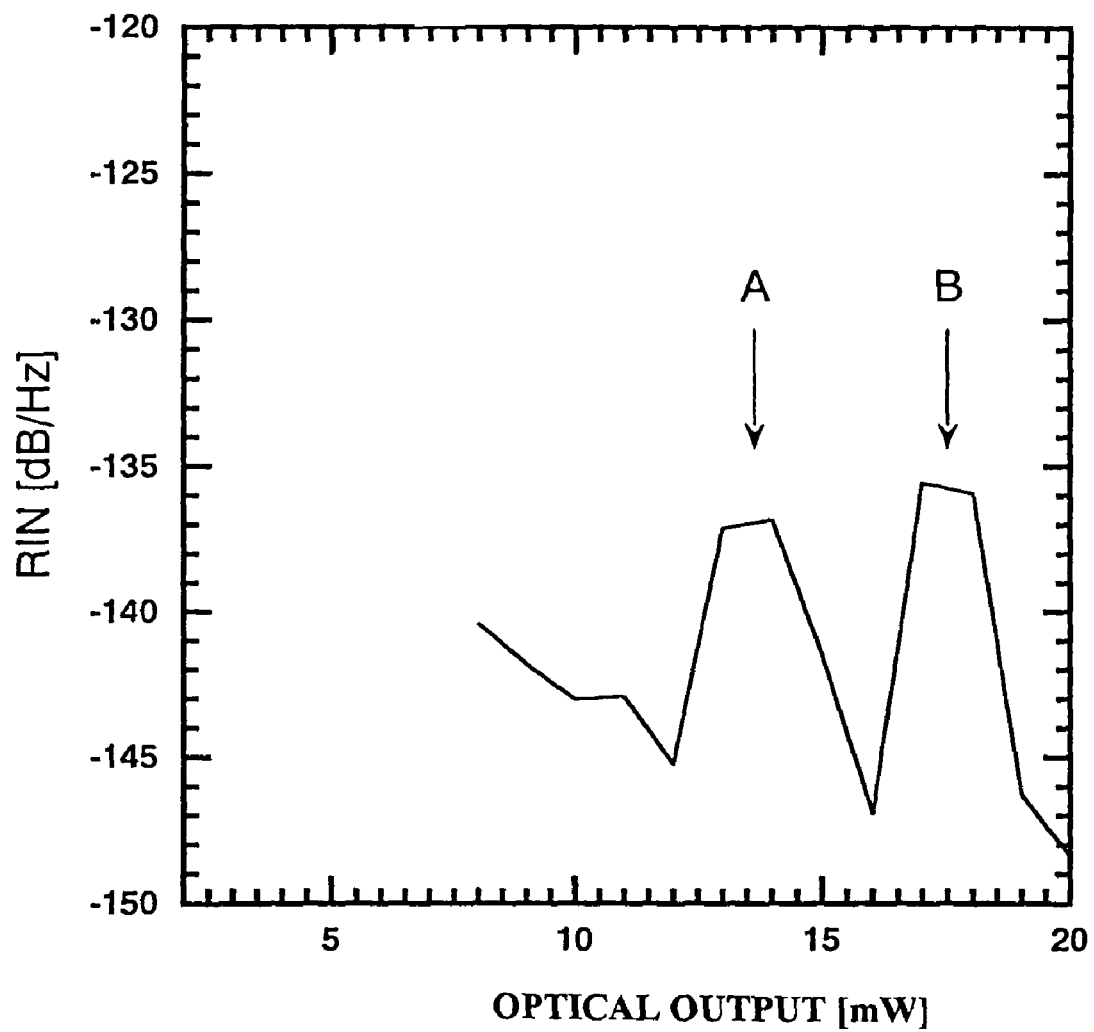
FIG. 5 is a graph illustrating noise characteristics of a conventional GaN-based laser device.

The noise characteristics of the laser device in itself were as shown in FIG. 5. In a graph of FIG. 5, the horizontal axis represents the laser light output (mW), and the vertical axis represents the RIN (dB/Hz). When the optical output is low, the relative noise is high due to effect of spontaneous emission of light, while the noise decreases as the optical output increases. The noise, however, increases with the specific optical outputs as shown by arrows A and B. From observation of the spectrum distribution at the time of such increase of noise, it was found that, among a plurality of modes with mode intervals of 0.3-0.5 nm, modes at two peak locations occurred alternately, presumably competing with each other.

In other words, in the laser structure of the above-described case, there are a plurality of longitudinal modes that tend to occur relatively easily at the mode intervals of 0.3-0.5 nm. It can be said that, compared to the mode interval of about 5 nm with which the mode competition is unlikely to occur, the mode interval of 0.3-0.5 nm is likely to cause the increase of RIN.

Further, when the GaN-based laser device is used for an optical information recording apparatus, even if the gain spectrum width is increased by intensity modulation with high-frequency modulation or self pulsation, the coherency is unlikely to decrease and RIN is very likely to increase due to the strong mode selectivity.

As a cause of such strong mode selectivity bringing about the noise, it was considered that chip side surfaces opposite to each other to sandwich the stripe-shaped waveguide therebetween function as a secondary Fabry-Perot resonator, which affects the gain spectrum of the primary resonator of the stripe direction, to thereby cause a complex oscillation effect. In the example of FIG. 20, it is necessary to consider the effect of the secondary resonator formed with the chip-division surface and the mesa side surface located on the respective sides in the width direction of ridge stripe 2011. For example, it is considered that light leaked out of the stripe-shaped waveguide of the laser is not absorbed by the substrate or the like but oscillates in the secondary resonator, and it interferes with the mode confined in the stripe-shaped waveguide.

As such, it is expected that a laser device suffering less noise can be produce by designing a complex resonator to lessen mode selectivity or mode interval. Further, when the effect of high-frequency modulation or self pulsation is added to the laser device designed as described above, it is expected that the RIN can further be lowered and then errors can be prevented at the time of recording or reading information to or from an optical disk or the like. It is considered that the mode selectivity can be lessened when at least one of the device side surfaces opposite to each other to sandwich the striped-shaped waveguide in its width direction therebetween is made not to function as the resonator end face.

In the case of an AlGaAs-based or InGaAlP-based laser device for emitting light within a wavelength band of 600-800 nm, a material (GaAs or the like) capable of absorbing the light of the emission wavelength is used for the substrate. This causes attenuation of light going to travel back and forth within the secondary resonator, and thus such phenomena due to the secondary resonator as in the aforementioned laser are not observed.

Hereinafter, various embodiments of the present invention implemented based on the above-described investigation will be explained in detail.

First Embodiment

Figure 1:
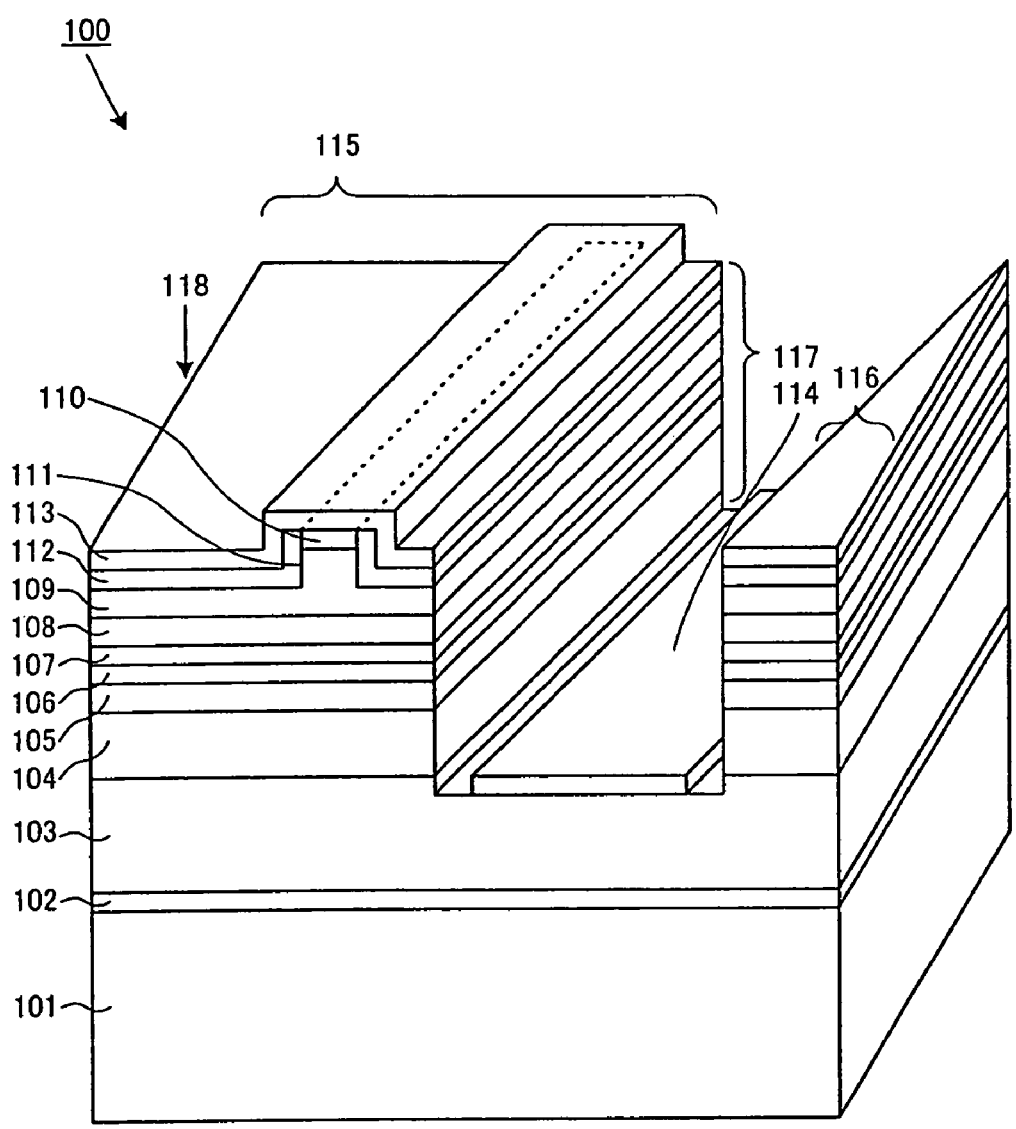
FIG. 1 is a schematic perspective view of a GaN-based laser device according to a first embodiment of the present invention.
Figure 2:
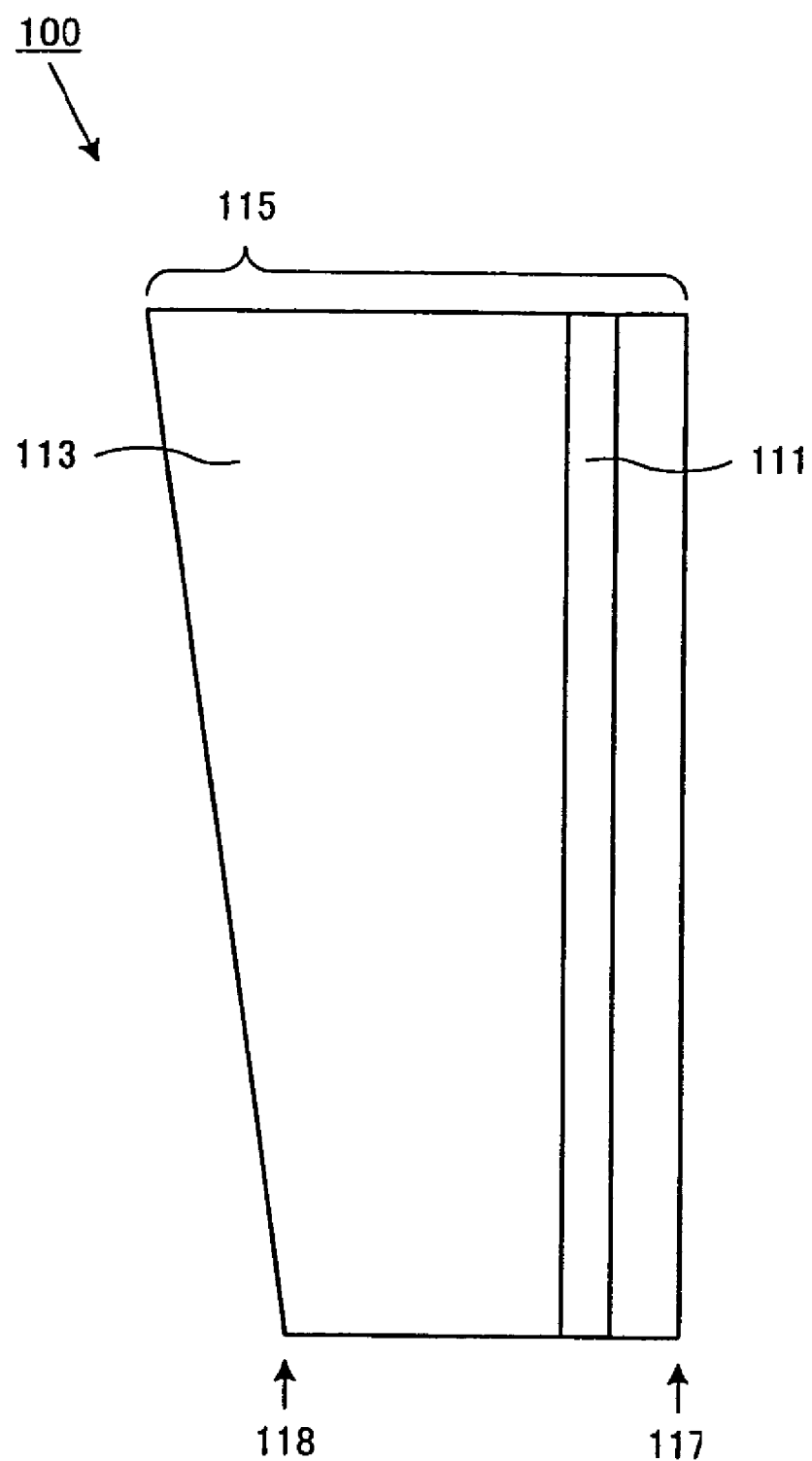
FIG. 2 is a schematic plan view corresponding to the GaN-based laser device of FIG. 1.

FIGS. 1 and 2 schematically show, in perspective view and plan view, respectively, a GaN-based laser 100 according to a first embodiment. Throughout the drawings in the present application, the same reference characters denote the same or corresponding portions.

In forming the GaN-based laser 100 of the present embodiment, firstly, a 400 µm thick sapphire substrate 101 having a (0001) plane as its main surface is rinsed, which is followed by high-temperature cleaning at about 1100° C. in a hydrogen ($H_2$) atmosphere within a MOCVD (metallorganic chemical vapor deposition) apparatus. After the substrate temperature is lowered to about 600° C., trimethyl gallium (TMG), ammonia ($NH_3$), silane ($SiH_4$) as a dopant, and hydrogen ($H_2$) as a carrier gas are introduced to grow a Si-doped n-type GaN layer as a buffer layer 102 to a thickness of 0.03 µm on substrate 101.

Next, the substrate temperature is raised to about 1050° C., while letting $NH_3$ flaw with $N_2$ as a carrier gas. Thereafter, with the carrier gas changed from $N_2$ to $H_2$, TMG and $SiH_4$ are also introduced to grow a Si-doped GaN layer as a lower contact layer 103 to a thickness of 4 µm. Subsequently, TMG and trimethyl aluminum (TMA) are introduced at their prescribed ratio to form a Si-doped n-type $Al_{0.1}Ga_{0.9}N$ layer as a lower clad layer 104 to a thickness of 0.9 µm. Thereafter, with the supply of TMA stopped, a Si-doped n-type GaN layer as a lower guide layer 105 is formed to a thickness of 0.1 µm.

The supply of TMG is then stopped, and the carrier gas is changed from $H_2$ to $N_2$. At a substrate temperature lowered to 700° C., trimethyl indium (TMI) and TMG are introduced to grow a barrier layer (not shown) of $In_vGa_{1-v}N$ ($0 \leq v \leq 1$). Thereafter, the supply of TMI is increased by a prescribed ratio to grow a well layer (not shown) of $In_wGa_{1-w}N$ ($0 \leq w \leq 1$). These steps are repeated to form a multiple quantum well active layer 106 having an alternately stacked-layered structure of InGaN barrier layers and InGaN well layers (barrier layer/well layer/ . . . well layer/barrier layer).

After formation of active layer 106, the supply of TMI and TMG is stopped, and the substrate temperature is raised again to 1050° C. The carrier gas is changed from $N_2$ to $H_2$, and then TMG, TMA, and a p-type dopant of bis-cyclopentadienyl magnesium ($Cp_2Mg$) are introduced to grow a Mg-doped p-type $Al_{0.2}Ga_{0.8}N$ layer as an evaporation-preventing layer 107 to a thickness of 0.01 µm. Next, with the supply of TMA stopped, a Mg-doped p-type GaN layer as an upper guide layer 108 is grown to a thickness of 0.1 µm. Thereafter, with TMA introduced at a prescribed ratio, the flow rate of TMG is adjusted to form a Mg-doped p-type $Al_{0.1}Ga_{0.9}N$ layer as an upper clad layer 109 to a thickness of 0.5 µm. Finally, with the supply of TMA stopped, the supply amount of TMG is adjusted to grow a Mg-doped p-type GaN layer as an upper contact layer 110 to a thickness of 0.1 µm. After completion of the growth of upper contact layer 110, the supply of TMG and $Cp_2Mg$ is stopped and the substrate temperature is decreased. The obtained epitaxial wafer is taken out of the MOCVD apparatus at a room temperature.

Subsequently, the epitaxial wafer is processed into laser devices. Firstly, to form a stripe-shaped waveguide, a stripe-shaped resist (not shown) having a width of 2 µm is formed, and reactive ion etching (RIE) is conducted to form a ridge stripe 111. Thereafter, a silicon oxide film as a dielectric film 112 is formed by evaporation on the upper surface of the wafer for constriction of electric current. The resist is removed to expose upper contact layer 110 at the top of ridge stripe 111, and then Pd, Mo and Au are deposited in this order by evaporation to thereby form a p-side electrode 113. Subsequently, photolithography is employed to form a protective resist layer (not shown), and a mesa 115 is formed by dry etching to expose a part of n-type GaN contact layer 103. On the exposed part, Ti and Al are deposited in this order by evaporation to form an n-side electrode 114. In FIG. 1, the mesa side surface 117 is formed parallel to ridge stripe 111. The groove for formation of mesa 115 is made to extend from the upper surface of the device to reach at least the bottom of active layer 106, and preferably to reach lower contact layer 103.

The wafer processed up to formation of the n-side electrode is subjected to polishing or the like to have a thickness of 60 µm to facilitate division thereof. Thereafter, the wafer is divided into bars by pseudo-cleavage. The surfaces created by the division are utilized as the mirror end faces of the resonators in the stripe direction. Adjustment of the thickness of the wafer to about 60-160 µm facilitates division of the wafer. The division is accurately conducted orthogonal to the stripe direction. The resonator length is made to 500 µm.

Next, each bar is divided approximately parallel to the stripe direction into devices. For example, the needle pressure (load when the needle is pressed onto the wafer) at the time of scribing may be increased to press and break the bars into chips. In the example shown in FIGS. 1 and 2, the chip-division surface 118 is formed at 12 degrees to the stripe direction.

GaN-based laser device 100 as shown in FIGS. 1 and 2 is completed through the above-described process. Note that FIG. 2 shows only mesa portion 115 for better understanding of the features of the present embodiment. In GaN-based laser device 100, the end faces of the secondary resonator formed by the mesa side surface 117 and chip-division surface 118 opposite to each other to sandwich the stripe-shaped waveguide in its width direction therebetween are tilted relative to each other, as shown in FIG. 2.

Figure 4:
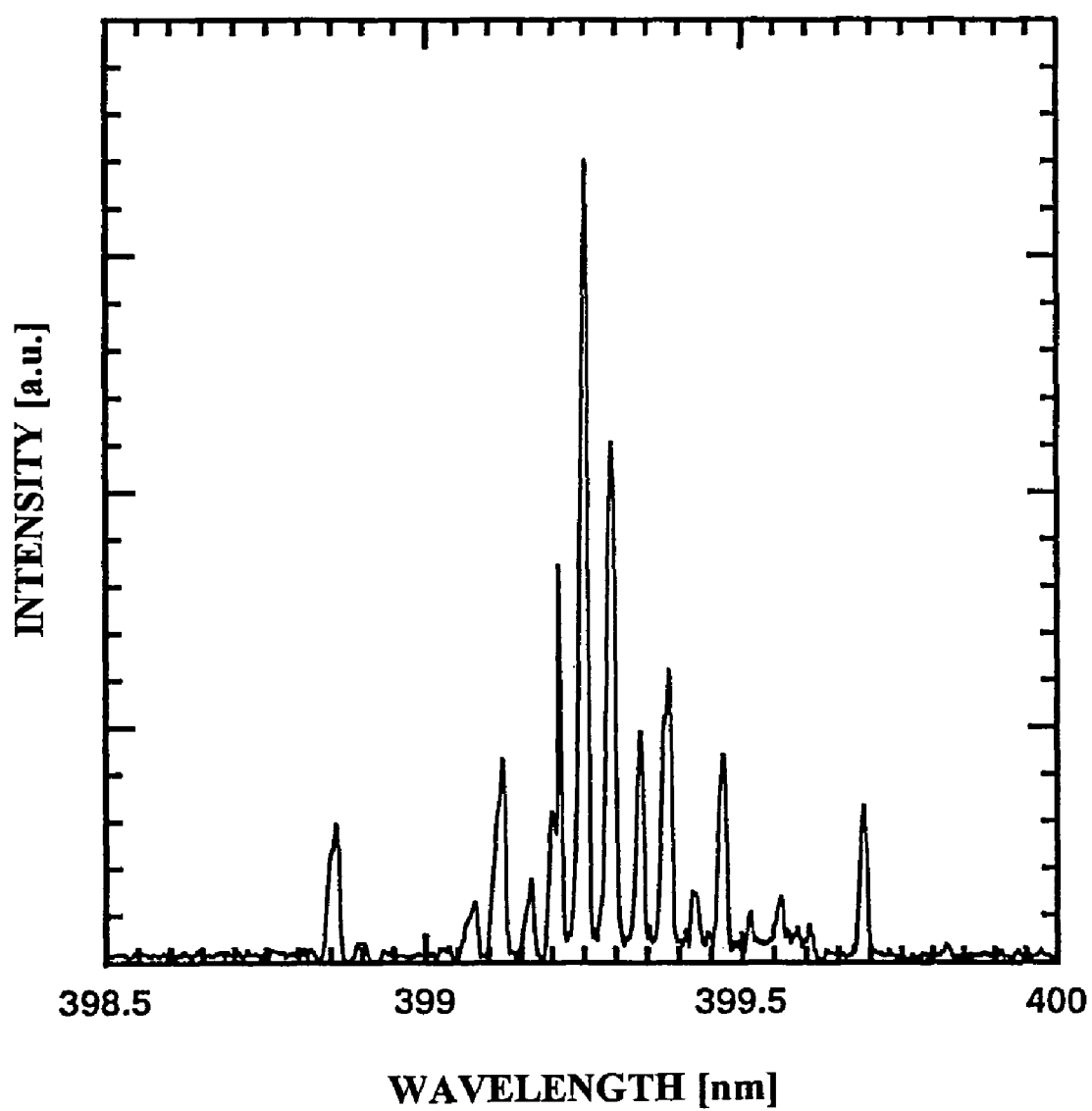
FIG. 4 is a graph illustrating emission spectrum distribution of the GaN-based laser device according to the first embodiment.
Figure 6:
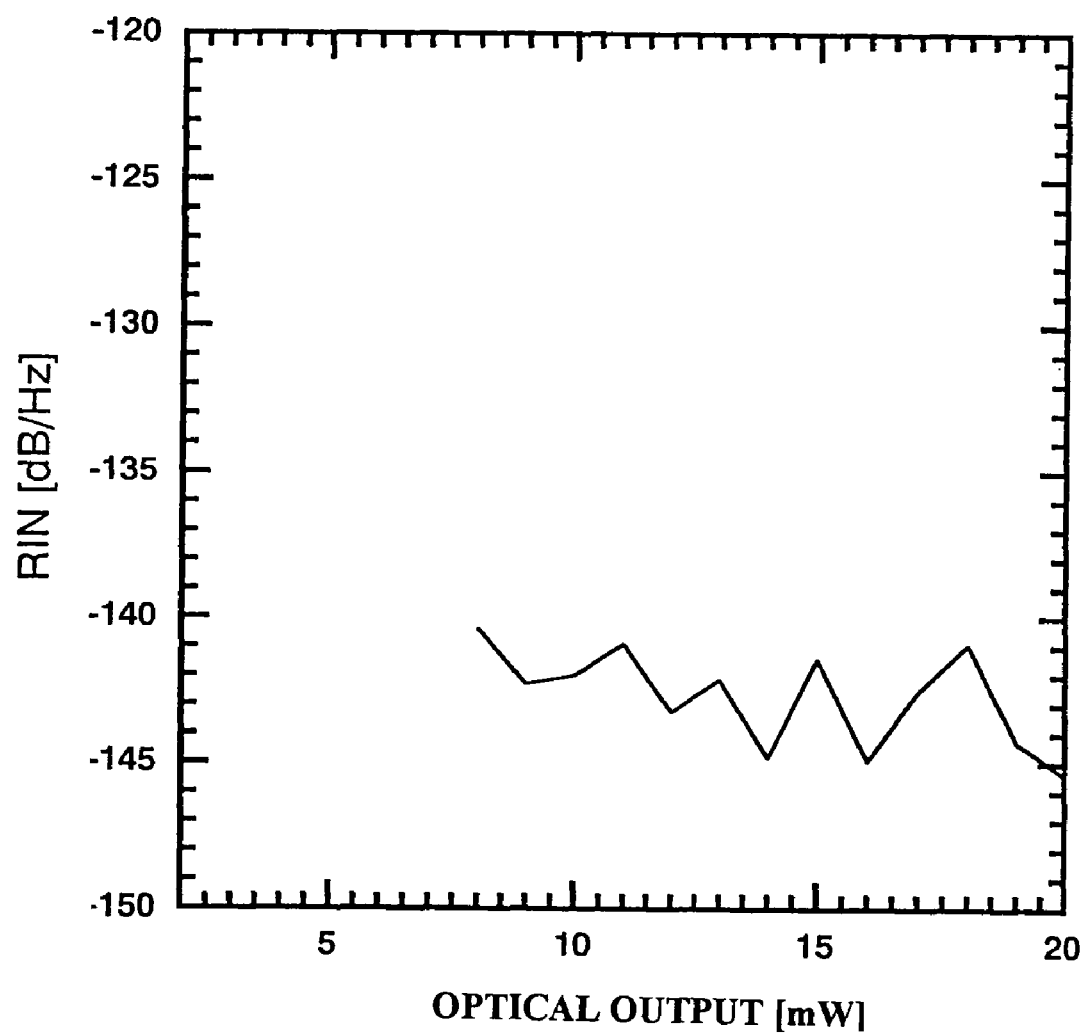
FIG. 6 is a graph illustrating noise characteristics of the GaN-based laser device according to the first embodiment.

The graph of FIG. 4 shows the emission spectrum distribution obtained with this GaN-based laser device 100. It is seen from FIG. 4 that oscillations occur at the Fabry-Perot mode intervals $\lambda_0$, unlike the case of FIG. 3. That is, mode selectivity is almost nullified in the laser device of the present embodiment. As such, relative intensity difference between the neighboring modes at mode interval $\lambda_0$ decreases, and it is possible to considerably lower the RIN by further carrying out intensity modulation by high-frequency modulation or self pulsation to lower the coherency. Since the difference in gain of the neighboring modes can be made small by weakening the mode selectivity, peaks A and B as shown in FIG. 5 have disappeared in terms of noise of the laser in itself. It has been confirmed that RIN can be decreased by at most 10 dB as shown in FIG. 6.

The configuration and fabrication method of GaN-based laser device 100 described in the present embodiment may be modified within the following ranges.

Firstly, for the barrier and well layers included in active layer 106, the $In_xGa_{1-x}N$ ($0 \leq x \leq 1$) composition ratios and film thicknesses may be set to achieve the emission wavelength in a range of 370-430 nm, and the number of well layers may be selected in a range of 2-6. The effect of the present invention can be obtained even if another material is mixed at a small amount in active layer 106. Further, the materials for the p-side electrode may be Pd/Pt/Au, Pd/Au, or Ni/Au, and the materials for the n-side electrode may be Hf/Al, Ti/Mo, or Hf/Au, other than described above.

The relative tilt of chip-division surface 118 with respect to mesa side surface 117 may be selected in a range of 3-25 degrees. If the tilt is less than 3 degrees, mesa side surface 117 and chip-division surface 118 opposite to each other to sandwich the stripe-shaped waveguide in its width direction therebetween function as a secondary resonator to strengthen the mode selectivity, in which case it is difficult to obtain the effect of the present invention. Although the inventive effect may be obtained by increasing the tilt, it leads to increase of the margin required for cutting the wafer into device chips. The margin larger than the device size would result in decrease in number of obtainable devices, so that a smallest possible margin is preferable. A GaAs-based laser device normally has a width of 200-300 μm. The width of a GaN-based laser device will approach this range in the future. Thus, the angle of division suppressing the increase of chip size due to the margin is considered to be at most about 25 degrees.

The relative tilt of chip-division surface 118 to mesa side surface 117 is more preferably in a range of 10-20 degrees. The tilt of at least about 10 degrees is preferable to sufficiently ensure the effect of the present invention. On the other hand, to perform chip-division at a position apart by at least about 50 μm from the stripe to protect the end faces of the laser resonator in the stripe direction, the tilt may be made not to exceed about 20 degrees.

In the present embodiment, the chip-division line is set on the mesa portion. Thus, a remaining portion 116 of the mesa portion is formed on the chip, as shown in FIG. 1. Mesa remaining portion 116 is not related to the essential features of the present invention, and it may be cut off to facilitate the later process of chip-mounting, for example. Further, the chip-division method is not restricted to the one described in the present embodiment. Dicing, scribing followed by braking, and other techniques may also be employed. The resonator length is not restricted to 500 μm, but may be changed as desired.

Second Embodiment

Figure 7:
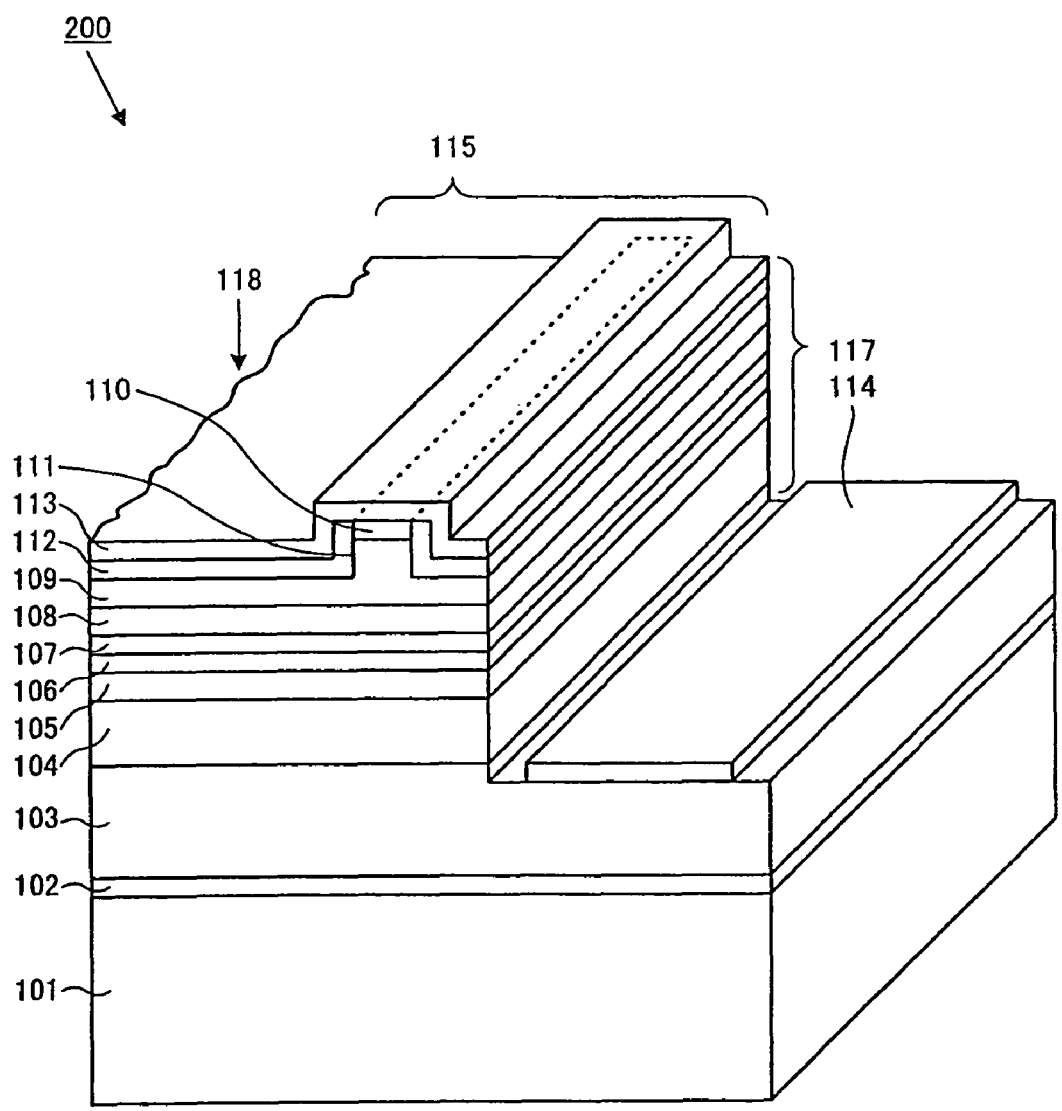
FIG. 7 is a schematic perspective view of a GaN-based laser device according to a second embodiment of the present invention.

FIG. 7, which is similar to FIG. 1, schematically shows a GaN-based laser device 200 according to a second embodiment.

A distinctive feature of the present embodiment is that chip-division surface 118 of the device has surface roughness. At the time of chip-division parallel to the stripe direction, the technique to scribe with a weak force and then brake with a strong force, for example, may be employed to naturally introduce such surface roughness on the broken-out section.

With such surface roughness provided to chip-division surface 118, mesa side surface 117 and chip-division surface 118 opposite to each other to sandwich the stripe-shaped waveguide in its width direction therebetween do not function any longer as the mirror end faces of the secondary resonator, and fundamental lasing at the longitudinal mode intervals determined by the resonator length in the stripe direction becomes possible. At this time, the surface roughness of chip-division surface 118 is set to correspond to more than a RMS (root-mean-square) roughness value of 50 nm measured with an atomic force microscope. The effect of the present invention may not be obtained with the surface roughness less than the above.

Although the mesa remaining portion similar to that of the first embodiment is formed in the present embodiment as well, it is then cut off in the second embodiment, since cracks or the like possibly included in the remaining portion would adversely affect the later process of chip-mounting.

Third Embodiment

Figure 8:
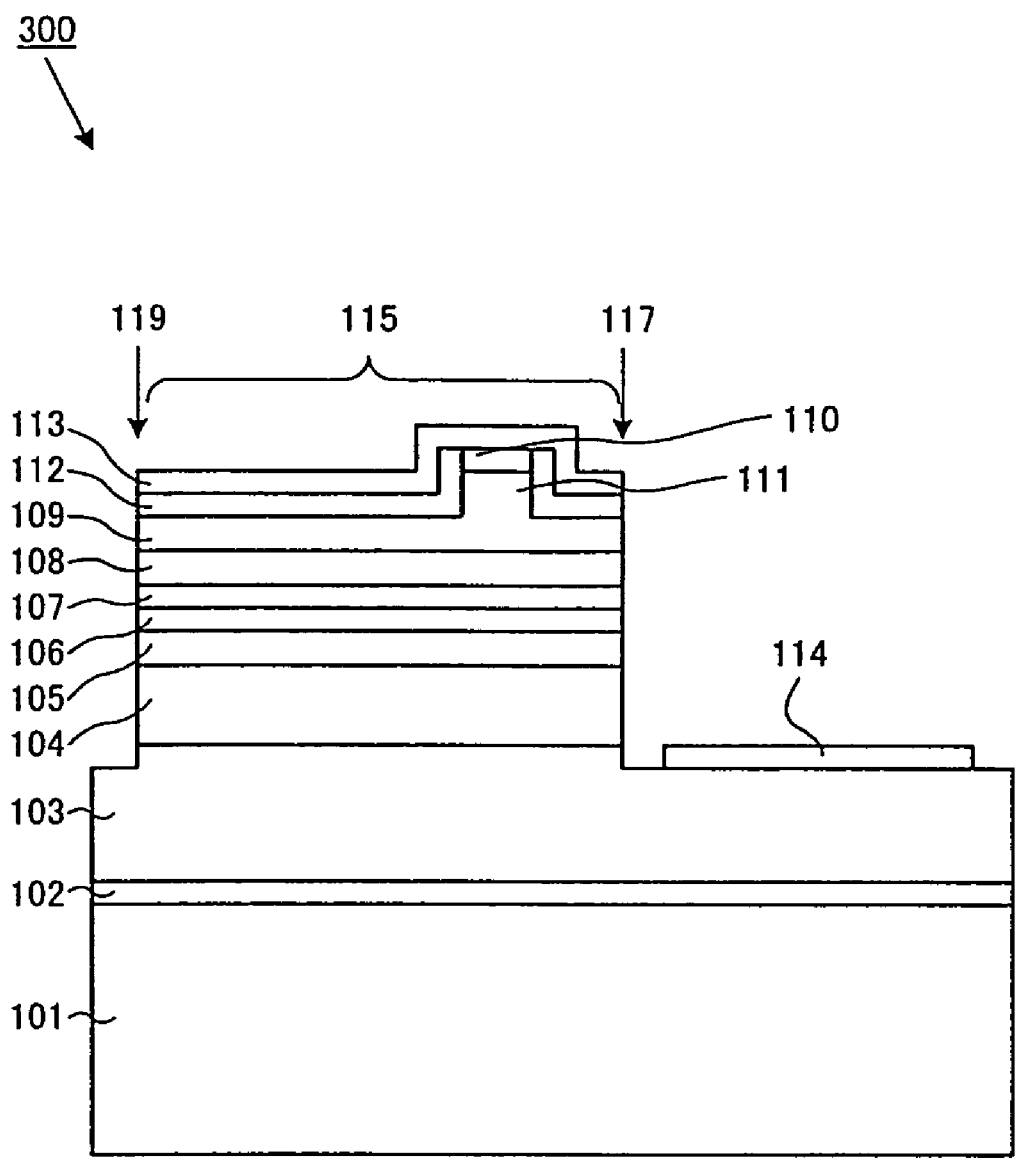
FIG. 8 is a schematic cross sectional view of a GaN-based laser device according to a third embodiment of the present invention.

FIG. 8 is a cross sectional view schematically showing a GaN-based laser device 300 according to a third embodiment. FIG. 2 can be referred to as a plan view of this GaN-based laser device 300.

A first distinctive feature of the present embodiment is that the side surfaces opposite to each other to sandwich the stripe-shaped waveguide in its width direction therebetween are formed with a first mesa side surface 117 close to n-side electrode 114 and a second mesa side surface 119 close to a chip-division line. More specifically, a mesa 115 is formed by dry etching, after forming a resist layer pattern on the wafer so as to make first mesa side surface 117 parallel to the longitudinal direction of ridge stripe 111 and second mesa side surface 119 tilted with respect to the first mesa side surface. Such a resist layer pattern can readily be formed by designing the photo mask. The chip-division can be carried out such that the chip-division surface does not cross mesa side surface 119.

A second distinctive feature of the present embodiment is that second mesa side surface 119 is at 8 degrees to first mesa side surface 117. The angle between these mesa side surfaces may be selected in the angle range similar to that in the case of the first embodiment, for the similar reasons.

The mesa of the second embodiment laser device produced as described above has its upper surface as shown in FIG. 2, though in this case, chip-division surface 118 should be read as second mesa side surface 119.

Fourth Embodiment

Figure 9:
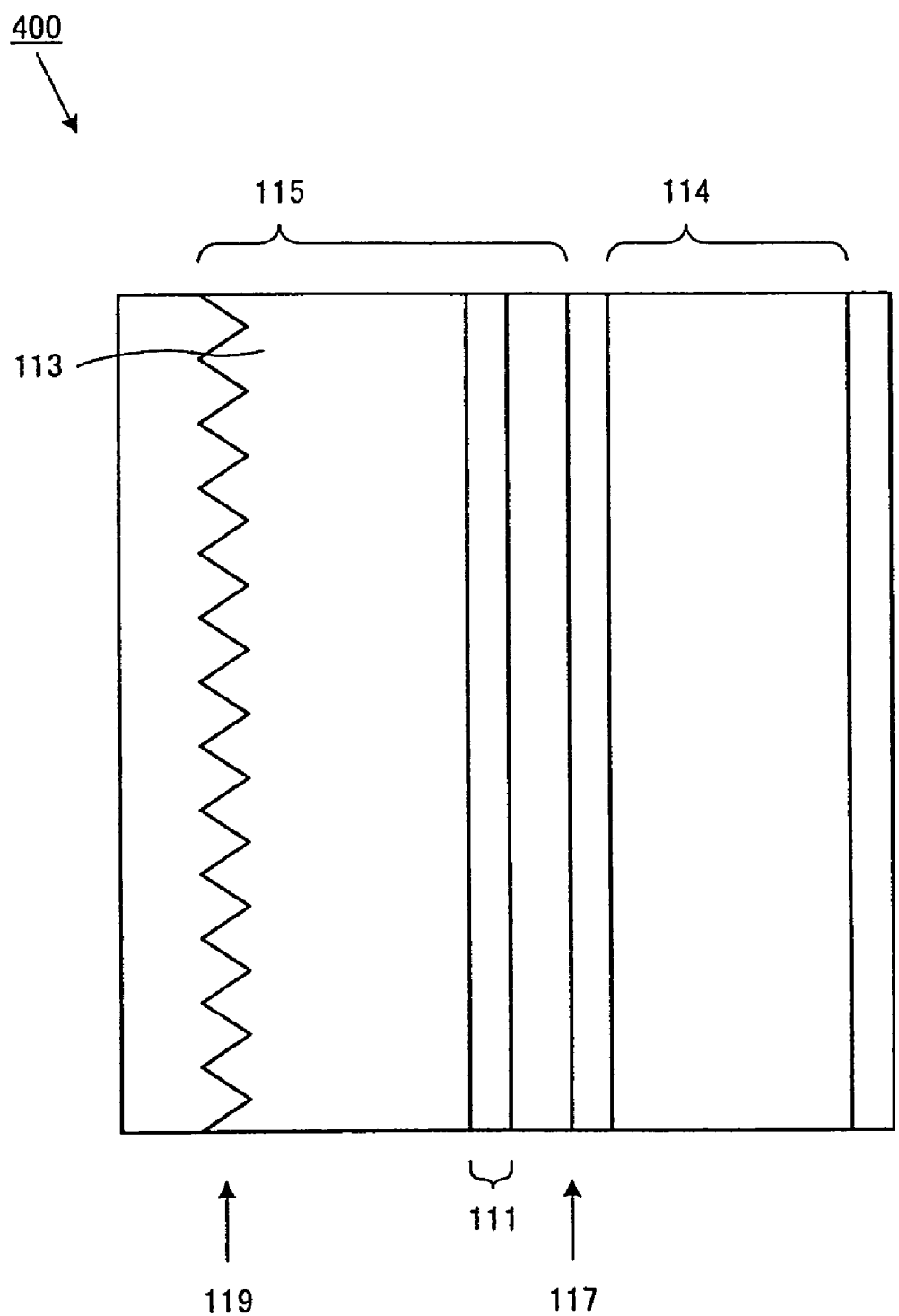
FIG. 9 is a schematic plan view of a GaN-based laser device according to a fourth embodiment of the present invention.

FIG. 9 is a plan view schematically showing a GaN-based laser device 400 according to a fourth embodiment. FIG. 8 may be referred to as a cross sectional view of GaN-based laser 400.

A distinctive feature of the present embodiment is that a first mesa side surface 117 close to n-side electrode 114 and a second mesa side surface 119 close to the chip-division surface constitute the side surfaces opposite to each other to sandwich the stripe-shaped waveguide in its width direction therebetween, with second mesa side surface 119 represented by a zigzag line in the plan view of FIG. 9. Each of a plurality of partial side surfaces included in second mesa side surface 119 is tilted with respect to first mesa side surface 117. More specifically, after forming a resist layer pattern so as to make first mesa side surface 117 parallel to ridge stripe 111 and second mesa side surface 119 with facetted partial surfaces, mesa 115 can be formed by dry etching. Such a resist layer pattern can readily be formed by designing the photo mask, similarly as in the case of the third embodiment. Device 400 can be cut off such that the chip-division surface does not traverse mesa side surface 119.

In the plan view of FIG. 9, each of the line segments constituting the zigzag line representing second mesa side surface 119 may have a tilt angle of more than 3 degrees and less than 90 degrees with respect to first mesa side surface 117. If the tile angle is less than 3 degrees, the side surfaces opposite to each other to sandwich the stripe-shaped waveguide in its width direction therebetween will function as the secondary resonator. In such a case, mode selectivity increases, making it difficult to obtain the effect of the present invention. It is apparent that if the angle reaches 90 degrees, it can no longer be a second mesa side surface. In the present embodiment, the width for forming second mesa side surface 119 can be designed freely, which is advantageous in that a large margin for chip-division is unnecessary. Further, the tilts of the partial side surfaces of mesa side surface 119 may be increased to weaken the mode selectivity. That is, when the tilt angle of each partial side surface is increased, its width may be reduced and the number may be increased, or vice versa.

Various modifications are possible using the concept similar to that of the present embodiment. For example, partial flat surfaces and partial curved surfaces may be combined to form the second mesa side surface.

Fifth Embodiment

Figure 10:
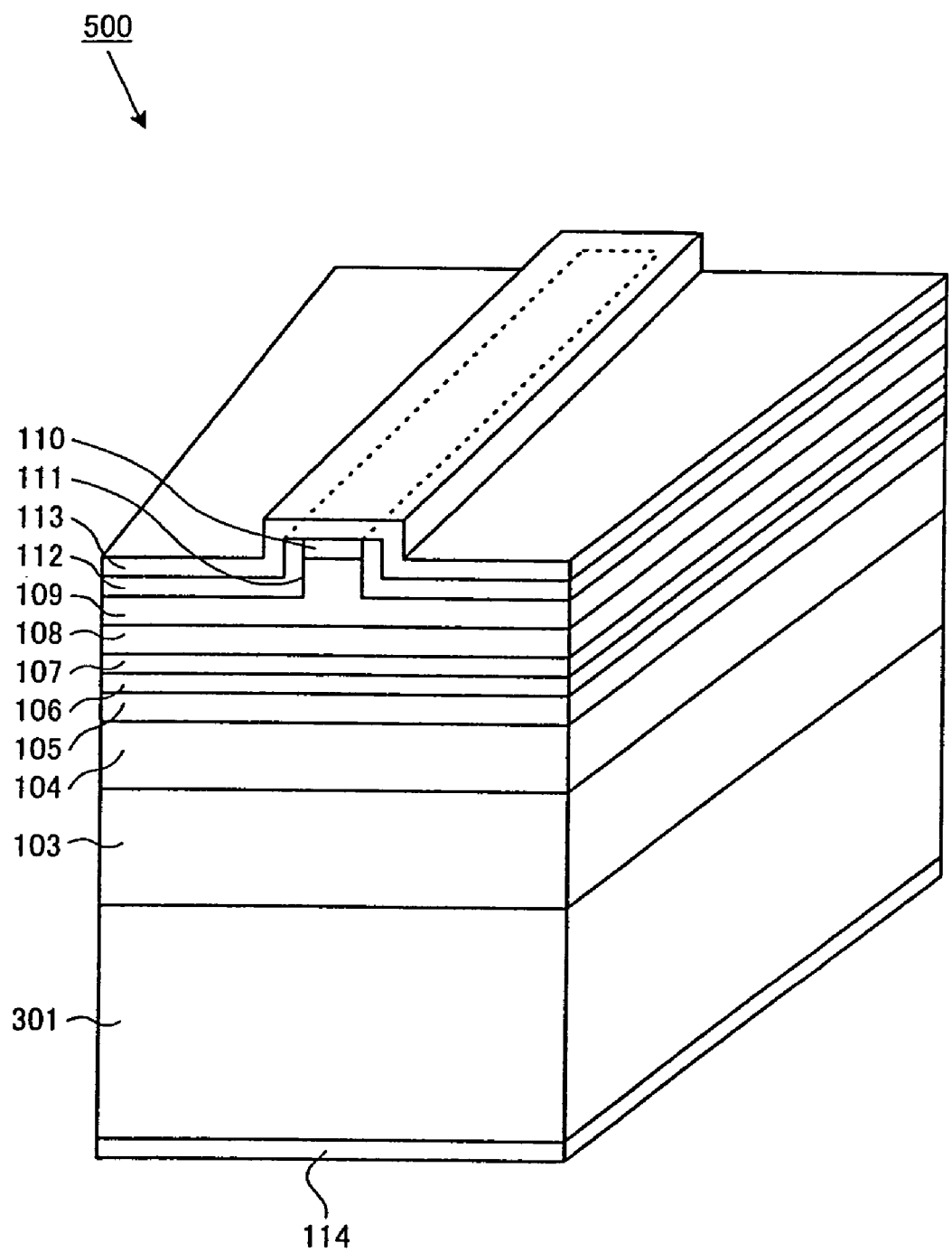
FIG. 10 is a schematic perspective view of a GaN-based laser device according to a fifth embodiment of the present invention.
Figure 11:
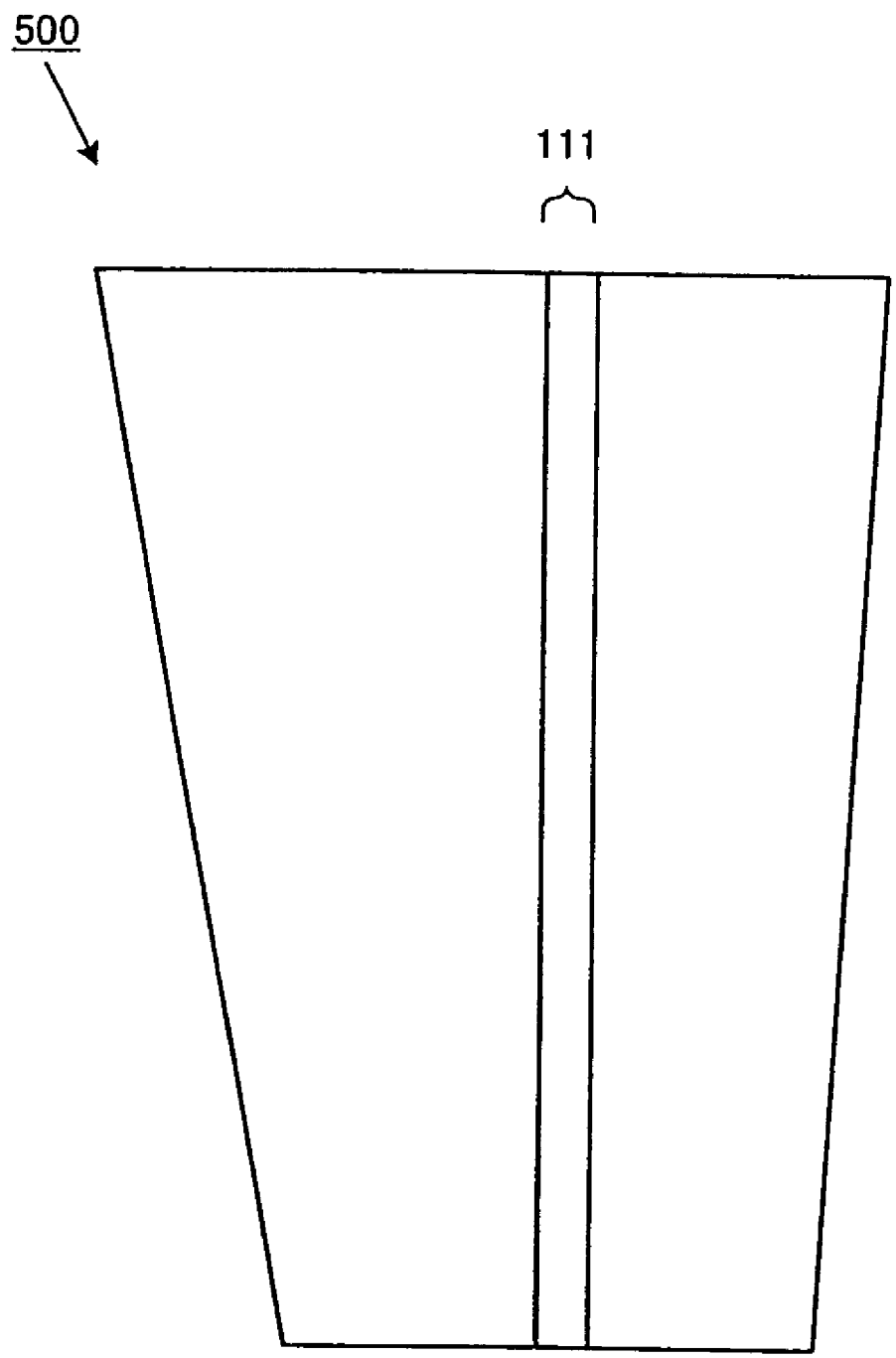
FIG. 11 is a schematic plan view corresponding to the GaN-based laser device of FIG. 10.

FIGS. 10 and 11, similar to FIGS. 1 and 2, respectively, schematically show a GaN-based laser device 500 according to a fifth embodiment.

A first distinctive feature of the present embodiment is that a conductive n-type GaN substrate 301 having a (0001) plane as its main surface is employed. As such, it is possible to form n-side electrode 114 on this conductive n-type GaN substrate 301, and this can avoid the need to form a mesa, leading to reduction of the number of process steps. For formation of n-side electrode 114, after adjusting the wafer thickness to about 160 μm, the materials for the electrode can be deposited over the entire region on the back surface of n-type GaN substrate 301.

A second distinctive feature of the present embodiment is that the side surfaces opposite to each other to sandwich the stripe-shaped waveguide in its width direction therebetween are formed of chip-division surfaces, both not in parallel with the stripe direction as shown in the plan view of FIG. 11. The configuration in which the side surfaces opposite to each other to sandwich the stripe-shaped waveguide in its width direction therebetween are not relatively parallel is similar to that in the case of the first embodiment.

A third distinctive feature of the present embodiment is that a buffer layer is not formed at the time of forming the wafer including GaN-based laser device 500. Although there are some cases where a buffer layer is provided to relax surface strain of a GaN substrate and to improve the surface morphology and evenness (flatness) of the same even if the GaN substrate is used for homoepitaxial growth, the buffer layer can be omitted when the GaN substrate for crystal growth has good crystallinity. A ridge stripe 111 is formed in parallel with a <1-100> direction of n-type GaN substrate 301, and the resonator end faces orthogonal to the stripe direction are formed by cleavage.

In the present embodiment, the side surfaces opposite to each other to sandwich the stripe-shaped waveguide in its width direction therebetween are formed with the chip-division surfaces. In this case, the chip-division surfaces may have a relative tilt similar to that in the case of the first embodiment. When the substrate is of a GaN-based semiconductor, the chip-division in the stripe direction may be carried out by cleavage. If the two chip-division surfaces are made parallel to each other by cleavage, however, the cleavage surfaces facing each other may function as the secondary resonator, leading to increase of mode selectivity. Thus, the cleavage surfaces not parallel to each other should be used to avoid this problem. However, of possible cleavage planes of a GaN-based semiconductor, {1-100} planes as well as {1120} planes are at 60 degrees with respect to each other, and {1-100} plane has an angle of 30 degrees to {1120} plane. This means that a large margin is needed for chip-division, leading to decrease in number of obtainable devices.

A mesa may be formed even in the GaN-based laser device of the present embodiment, accompanied with need of forming grooves for electrically separating devices or for helping the chip-division. In such a case, the side surfaces of the mesa may be configured to have the relative tilt angle similar to that in the case of the first embodiment.

Sixth Embodiment

Figure 12:
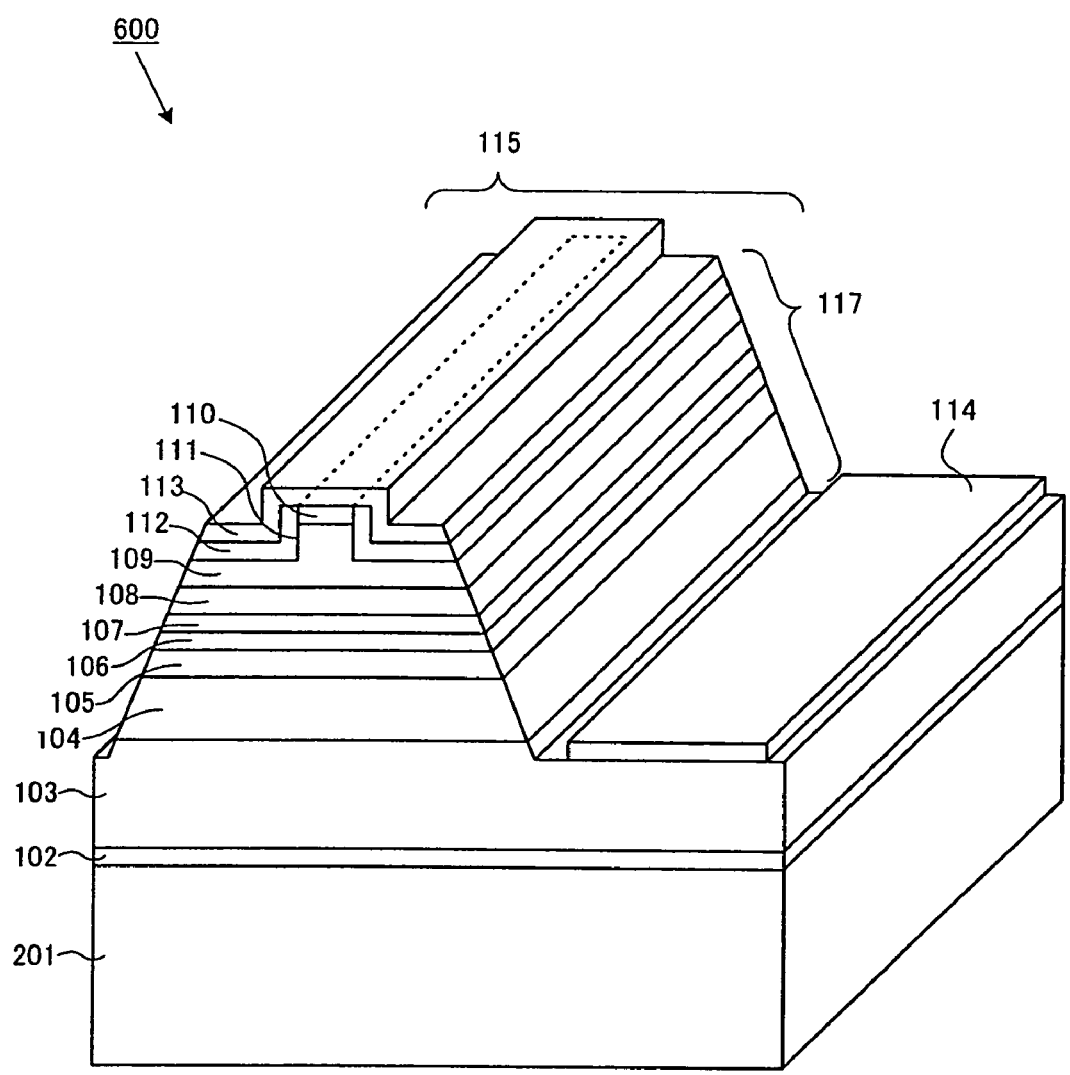
FIG. 12 is a schematic perspective view of a GaN-based laser device according to a sixth embodiment of the present invention.

FIG. 12, similar to FIG. 1, schematically shows a GaN-based laser device 600 according to a sixth embodiment.

A first distinctive feature of the present embodiment is that a 450 μm-thick, non-doped GaN substrate 201 having a (0001) plane as its main surface is used for the substrate of GaN-based laser device 600. A buffer layer 102 is grown on GaN substrate 201, though buffer layer 102 may be omitted as described in the fifth embodiment.

A second distinctive feature of the present embodiment is that a mesa 115 is formed as shown in FIG. 12, with its side surface 117 tilted with respect to a plane perpendicular to an active layer 106. Such a mesa 115 may be formed in the following manner, after forming up to p-side electrode 113 similarly as in the fist embodiment.

Firstly, a photo-process is used to form a resist layer of a width enough to protect p-side electrode 113 and ridge stripe 111. The edges of the resist layer in the width direction may be made parallel to the stripe direction. Thereafter, heat treatment or the like is conducted to utilize the cohesive effect and/or surface tension of the resist so as to have the thickness of the resist layer pattern gradually thinned from the center to the edges in the width direction. As a result, the resist layer pattern has a shape raised in the center portion when seen in cross section orthogonal to the stripe direction. In this state, dry etching such as reactive ion etching (RIE) is carried out, with a gas such as oxygen mixed into the etching gas, to make the side edges of the resist layer pattern retreat during the etching thereby partially exposing lower contact layer 103. As such, mesa 115 is formed with mesa side surfaces 117 having a tilt angle of about 25 degrees with respect to a plane perpendicular to active layer 106. It is noted that etching may be conducted while making deposits on the mesa side surfaces, by adding a fluorine-containing gas such as hydrofluoric carbon (e.g., $CHF_3$) during the etching. In such a case, the step of making the resist gradually thinned toward the side edges can be omitted, thereby leading to reduction in number of process steps.

The depth of etching for formation of the mesa may be set similar to that in the case of the first embodiment. GaN-based laser device 600 shown in FIG. 12 is obtained through the above-described process.

The tilt of mesa side surface 117 with respect to the plane perpendicular to active layer 106 may be designed to fall within a range of more than 15 degrees and less than 90 degrees. If it is less than 15 degrees, the secondary resonator crossing the stripe-shaped waveguide will function, which may enhance the mode selectivity of the laser. It is evident that the mesa cannot be formed with the tilt angle of 90 degrees or more. To cancel the function of the secondary resonator, the tilt may be introduced only on one side of the mesa side surfaces facing each other.

Seventh Embodiment

Figure 13:
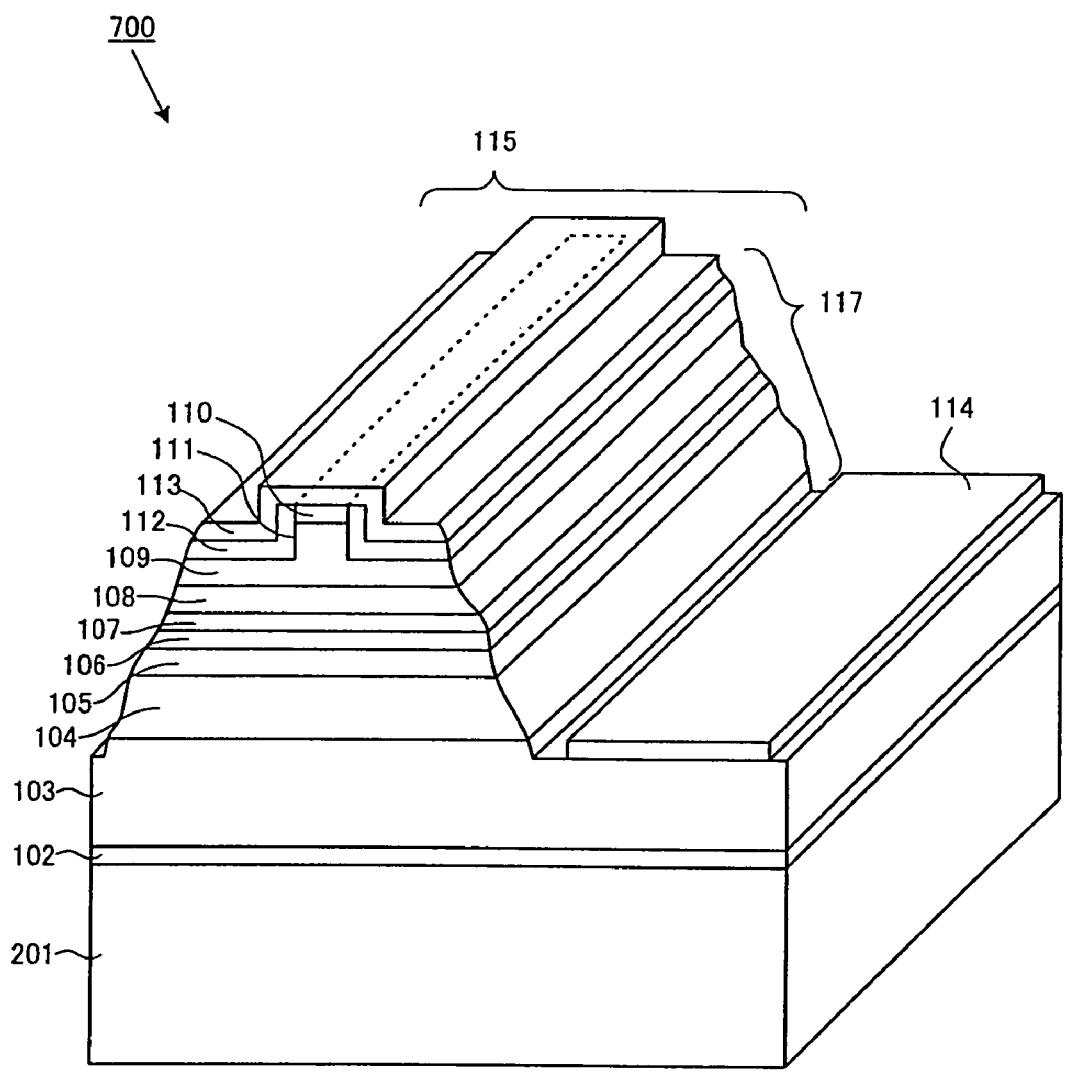
FIG. 13 is a schematic perspective view of a GaN-based laser device according to a seventh embodiment of the present invention.

FIG. 13, similar to FIG. 12, schematically shows a GaN-based laser device 700 according to a seventh embodiment.

A distinctive feature of the present embodiment is that mesa side surface 117 has the tilt similar to that in the sixth embodiment and is formed with a curved surface having the tilt angle locally varied. Such a mesa side surface may readily be formed by varying the etching gas composition during dry etching, for example, to change the ratio between the retreating speed of the side edges of the resist layer pattern and the etching rate of the GaN-based semiconductor.

In the present embodiment, mesa side surface 117 is formed such that a tangent plane at an arbitrary point of the curved surface has a tilt angle falling within a range of 20-30 degrees with respect to a plane perpendicular to active layer 106. When mesa side surface 117 is formed of such a curved surface, activation of the secondary resonator can be suppressed if the tilt angle of the curved surface with respect to the plane perpendicular to active layer 106 has its minimum to maximum values all falling within the range of 15-90 degrees, for the reasons as described in the sixth embodiment.

With the mesa side surfaces formed in this manner, the secondary resonator no longer functions, and thus, lasing at the Fabry-Perot mode intervals becomes possible.

Eighth Embodiment

Figure 14:
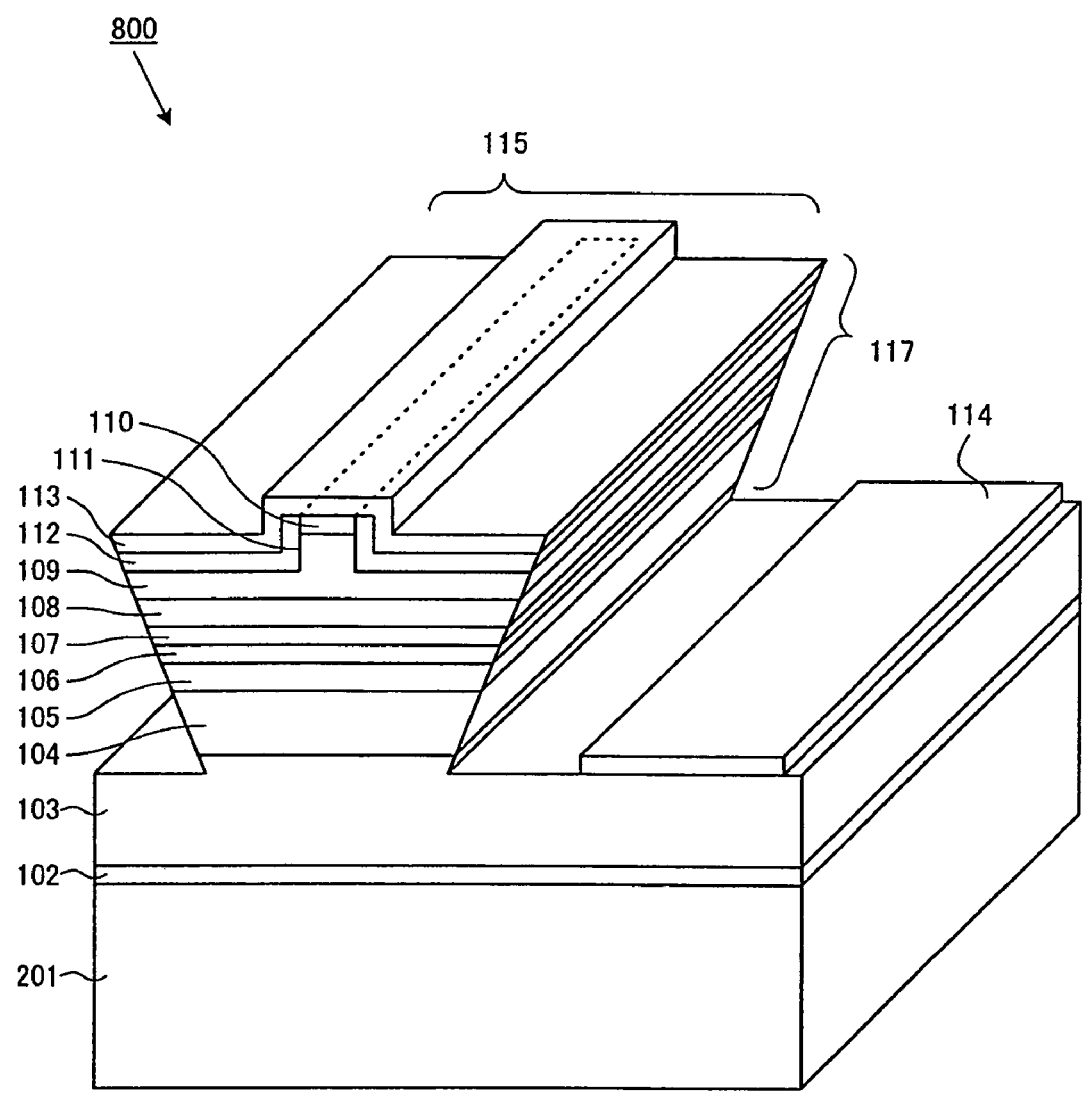
FIG. 14 is a schematic perspective view of a GaN-based laser device according to an eighth embodiment of the present invention.

FIG. 14, similar to FIG. 12, schematically shows a GaN-based laser device 800 according to a eighth embodiment.

A first distinctive feature of the present embodiment is that mesa 115 is formed in a reversed mesa shape. To form such a mesa, etching may be conducted with the wafer tilted, for example.

A second distinctive feature of the present embodiment is that mesa side surface 117 is formed at an angle of about 30 degrees with respect to a plane perpendicular to active layer 106.

Regarding the other matters not specifically referred to, the present embodiment is similar to the sixth embodiment.

Ninth Embodiment

Figure 15:
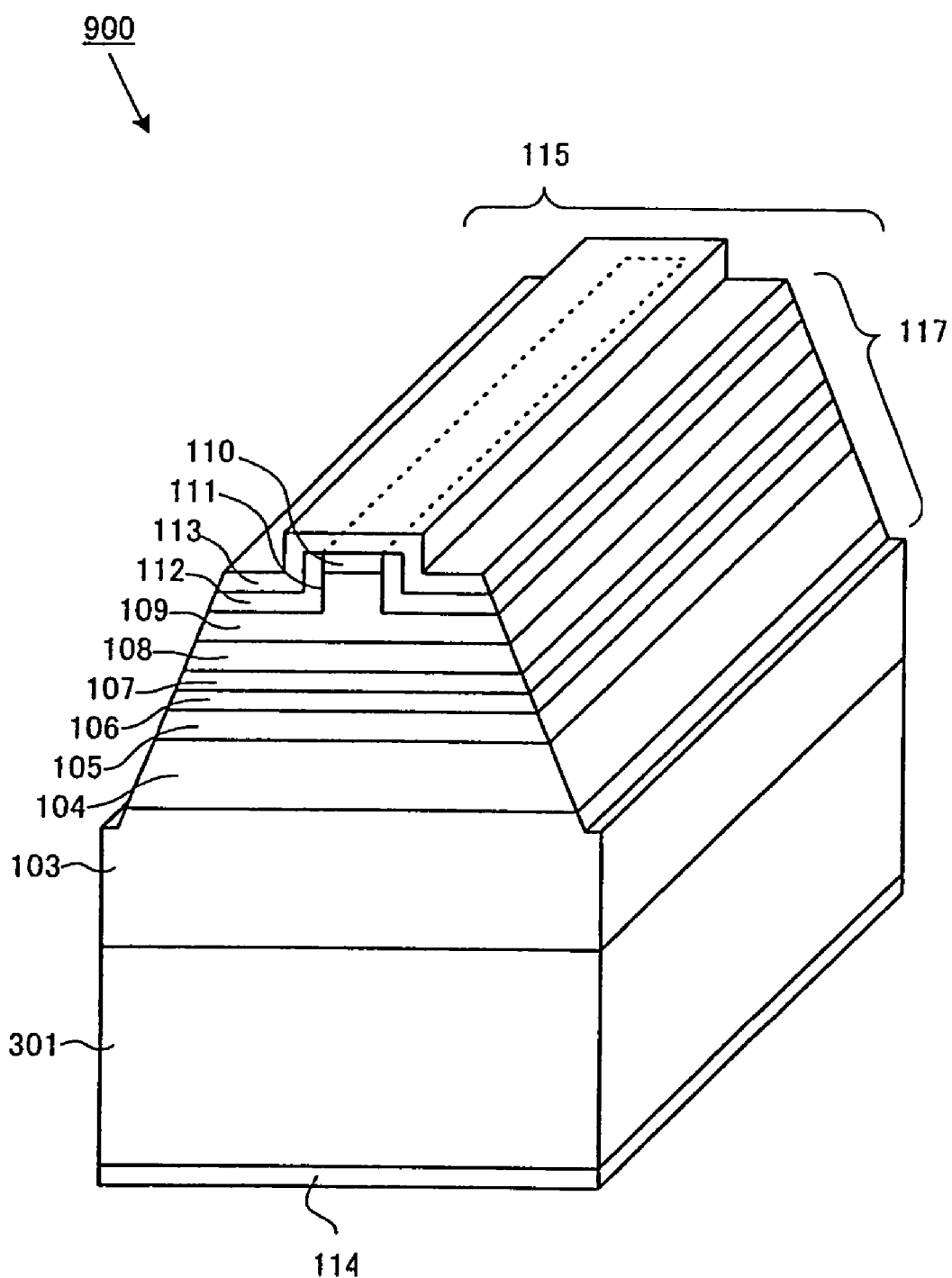
FIG. 15 is a schematic perspective view of a GaN-based laser device according to a ninth embodiment of the present invention.

FIG. 15, again similar to FIG. 12, schematically shows a GaN-based laser device 900 according to a ninth embodiment.

A first distinctive feature of the present embodiment is that a conductive n-type GaN substrate 301 is used, similarly as in the case of the fifth embodiment. Thus, n-side electrode 114 is formed on the back surface of n-type GaN substrate 301, again similarly as in the case of the fifth embodiment.

A second distinctive feature of the present embodiment is that mesa side surface 117 is formed at an angle of about 45 degrees with respect to a plane perpendicular to active layer 106. Even in the case that it is unnecessary to form n-side electrode 114 on the front side of the substrate, a mesa may have to be formed when a device failure test is to be conducted in the wafer state or when a groove for helping the chip-division is cut to reach the bottom of the active layer. In such a case, it is important to prevent the mesa from serving to enhance the mode selectivity of the GaN-based laser device.

Regarding the other matters not specifically referred to, the present embodiment is similar to the sixth embodiment.

Tenth Embodiment

Figure 16:
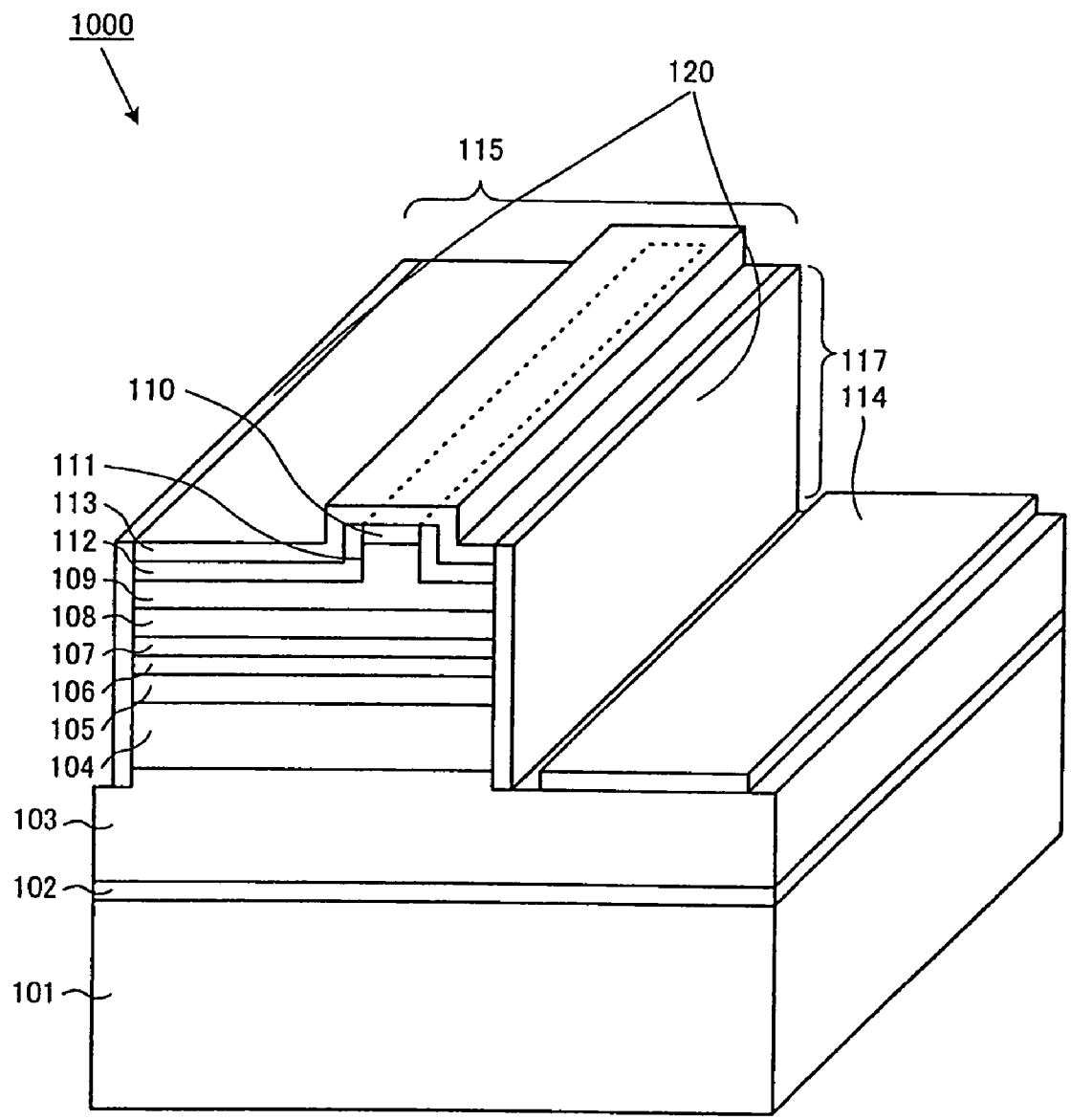
FIG. 16 is a schematic perspective view of a GaN-based laser device according to a tenth embodiment of the present invention.

A laser device of FIG. 16, which is similar to that of FIG. 8, is schematically illustrated as a GaN-based laser device 1000 according to a tenth embodiment.

A 450 μm-thick, non-doped GaN substrate 201 having a (0001) plane as its main surface is used in the present embodiment. The method for growing the other semiconductor layers is similar to that of the first embodiment.

A first distinctive feature of the present embodiment is that a mesa 115 is formed with a semiconductor stacked-layered structure grown on a main surface of non-doped GaN substrate 201, wherein anti-reflection films 120 are formed on a first mesa side surface 117 close to n-side electrode 114 and on a second mesa side surface 119 close to the chip-division line. First mesa side surface 117 and second mesa side surface 119 may be formed perpendicular to the active layer and parallel to the stripe direction. Mesa 115 and anti-reflection films 120 can be formed in the following manner.

Firstly, the structure similar to that of the first embodiment is formed up to p-side electrode 113. Thereafter, in forming the mesa, the photo-process is utilized to apply a resist layer to a width sufficient to protect p-side electrode 113 and ridge stripe 111. At this time, the side edges of the resist layer pattern are made parallel to the stripe direction. Dry etching such as RIE is then conducted to partially expose lower contact layer 103, and mesa 115 is formed to have side surfaces 117, 119 perpendicular to active layer 106. The depth of the groove for formation of the mesa may be set similarly as in the case of the sixth embodiment.

Thereafter, the resist is removed, and a resist is applied again to expose only first and second mesa side surfaces 117 and 119. Anti-reflection films 120 are then formed on mesa side surfaces 117 and 119 by film deposition with the wafer being tilted and rotated, or by a film deposition method such as sputtering which causes diffusive deposition. As anti-reflection film 120, a coating of multilayered film including silicon dioxide layer and titanium dioxide layer is formed to reflect only less than 10% of light of a lasing wavelength in a range of 390-420 nm in the GaN-based laser.

Thereafter, GaN-based laser device 1000 shown in FIG. 16 can be obtained buy carrying out formation of n-side electrode 114, adjustment of the wafer thickness, formation of the resonator and then chip-division. At the time of chip-division, attention must be paid so as not to break anti-reflection films 120 on the mesa side surfaces.

As the materials for the multilayer of anti-reflection film 120, those having a variety of refractive indexes can be used, which include silicon oxide, titanium oxide and other oxides such as alumina and zinc dioxide, as well as nitrides, sulfides and halogen compounds. There are a great number of conceivable combinations of the materials satisfying the conditions. Incidentally, the materials for anti-reflection film 120 should be insulative because the film coats the mesa side surface.

Anti-reflection film 120 is designed to reflect less than 10% in intensity of light in the wavelength range of 390-420 nm. If the reflectivity is greater than about 10%, the secondary resonator crossing the stripe-shaped waveguide comes to function, which may well enhance the mode selectivity. Further, the laser wavelength varies depending on the fabricating conditions and operating environment of the device. Thus, it is preferable that anti-reflection film 120 transmits light including wavelengths within a range of about 15 nm from the center of 405 nm that is the oscillation wavelength of a GaN-based semiconductor laser. Still further, although anti-reflection films 120 are shown to be deposited on the entire surfaces of mesa side surfaces 117 and 119 in FIG. 16, all that is needed is that the anti-reflection film covers at least the region from clad lower layer 104 to upper clad layer 109 between which the light is confined and guided along the active layer. The effect of canceling the function as the secondary resonator crossing the stripe-shaped waveguide can be obtained even if the anti-reflection film is formed only on one end face of the secondary resonator.

As such, with the anti-reflection film formed on the mesa side surface, the secondary resonator in the direction perpendicular to the stripe direction does no longer function, and then fundamental lasing becomes possible at the longitudinal mode intervals which are determined by the resonator length of the stripe direction.

Eleventh Embodiment

Figure 17:
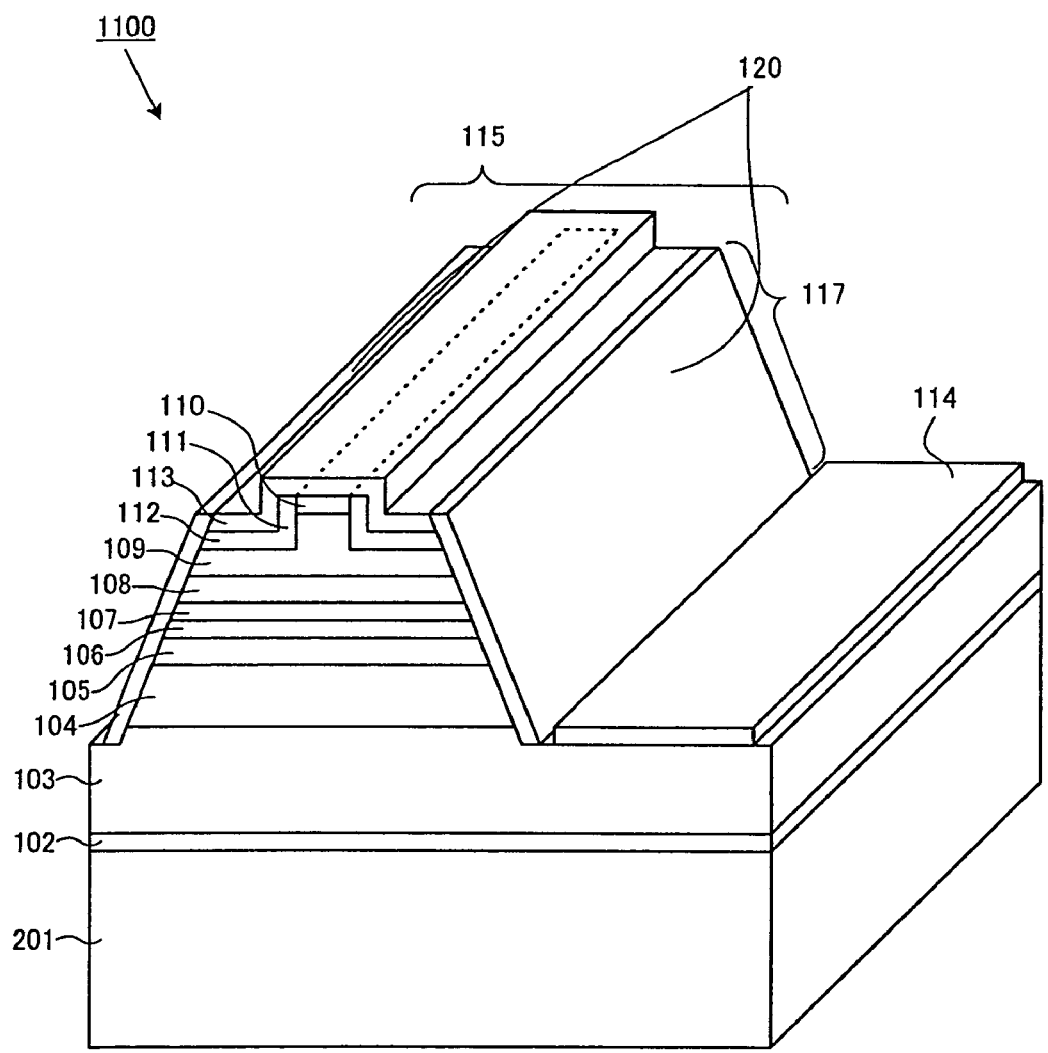
FIG. 17 is a schematic perspective view of a GaN-based laser device according to an eleventh embodiment of the present invention.

FIG. 17, similar to FIG. 16, schematically shows a GaN-based laser device 1100 according to an eleventh embodiment.

A distinctive feature of the present embodiment is that each of first and second mesa side surfaces 117 and 119 has a tilt with respect to the a perpendicular to the active layer, with the width of mesa 115 decreasing in the upward direction of the GaN-based laser device. Such mesa side surfaces 117, 119 may be formed in the similar manner as in the sixth embodiment. In the present embodiment, each of first and second mesa side surfaces 117 and 119 is formed to have an angle of about 10 degrees with respect to the plane perpendicular to the active layer. This facilitates deposition of materials for forming anti-reflection films 120 on mesa side surfaces 117, 119, thereby reducing variation in the film thickness, avoiding an area not coated with the anti-reflection film and improving the production yield.

Regarding the other matters not specifically referred to, the present embodiment is similar to the tenth embodiment.

Twelfth Embodiment

Figure 18:
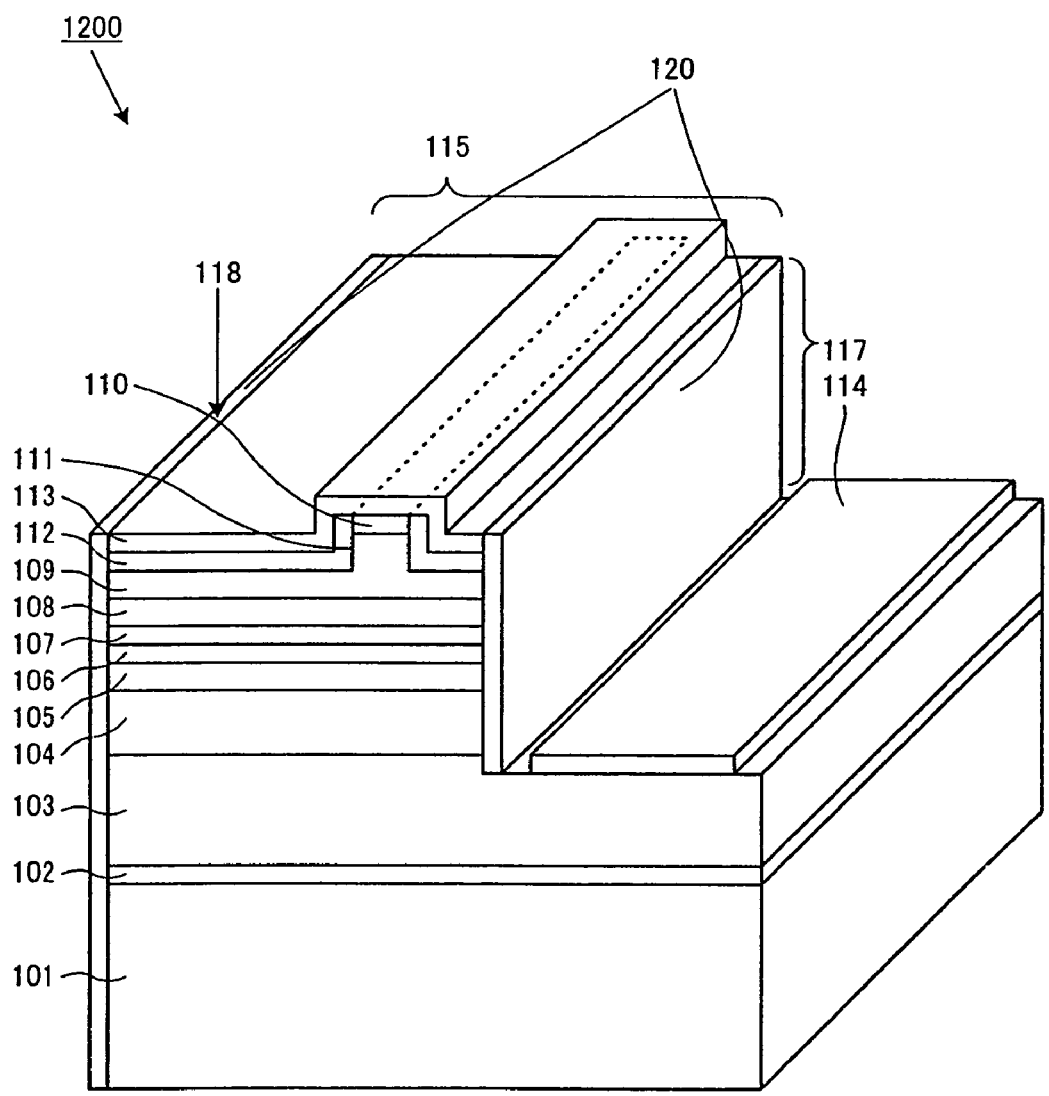
FIG. 18 is a schematic perspective view of a GaN-based laser device according to a twelfth embodiment of the present invention.

FIG. 18, similar to FIG. 16, schematically illustrates a GaN-based laser device 1200 according to a twelfth embodiment.

A distinctive feature of the present embodiment is that one of the side surfaces opposite to each other to sandwich the stripe-shaped waveguide in its width direction therebetween is formed with a chip-division surface 118, and anti-reflection film 120 is formed on each of chip-division surface 118 and mesa side surface 117. In the case that the mesa side surfaces constitute the mirror end faces of the secondary resonator, it is necessary to provide a cutting margin enough to avoid breakage of the anti-reflection films on the mesa side surfaces. In the present embodiment, such a margin is unnecessary, and thus, the number of obtainable devices increases. The chip-division can be done regardless of the mesa side surfaces, possibly improving the production yield.

When a chip-division line 118 between the neighboring devices in the laser bar is provided on mesa 115, a mesa remaining portion (not shown) is left on the n-side electrode side of the device. Although this portion is usually removed in the present embodiment, it may be left unremoved in consideration of the number of process steps.

Regarding the other matters not specifically referred to, the present embodiment is similar to the tenth embodiment.

Thirteenth Embodiment

Figure 19:
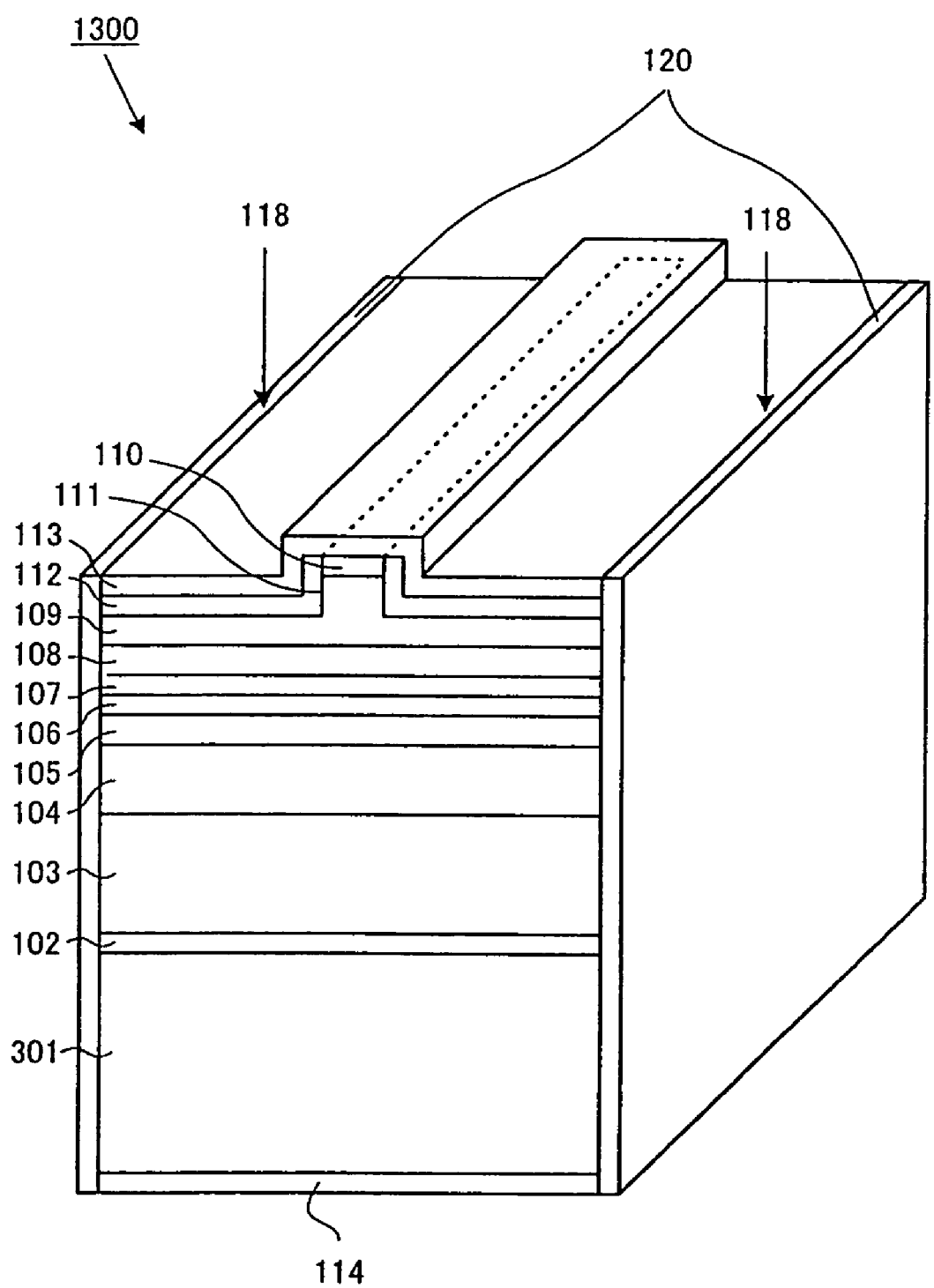
FIG. 19 is a schematic perspective view of a GaN-based laser device according to a thirteenth embodiment of the present invention.

FIG. 19, similar to FIG. 18, schematically shows a GaN-based laser device 1300 according to a thirteenth embodiment.

A distinctive feature of the present embodiment is that a conductive n-type GaN substrate 301 is used and anti-reflection film 120 is formed on each of chip-division surfaces 118 constituting the end faces of the secondary resonator. The n-side electrode 114 is formed on the back surface of conductive n-type GaN substrate 301 in the similar manner as in the fifth embodiment.

There may be a case, even if a conductive substrate is used, the device failure test is to be conducted in the wafer state or a groove for helping the chip-division needs to be cut down to the active layer, similarly as in the case of the ninth embodiment. Even in such a case, the effect of suppressing the function of the secondary resonator can be obtained if the mesa side surfaces constituting the secondary resonator end faces are coated with anti-reflection films 120. After carrying out the chip-division, the coating of anti-reflection film 120 can be conducted in the similar manner as in the tenth embodiment.

Regarding the other matters not specifically referred to, the present embodiment is similar to the tenth embodiment.

Although various embodiments of the present invention have been described above, the present invention is not restricted to the above-described embodiments, and various modifications are possible based on the technical ideas of the present invention. For example, although the waveguide structure of the semiconductor laser device has been explained to be a ridge stripe structure, an electrode stripe structure, a self-aligned structure (SAS), and other structures including a channeled substrate planar (CSP) structure may be employed without affecting the essential features of the present invention, and the inventive effects can be enjoyed with those structures.

Further, although the non-doped GaN substrate, the n-type GaN substrate and the sapphire substrate have been used as the substrates of the GaN-based laser devices in the above-described embodiments, it is also possible to use a GaN-based substrate, a spinel substrate, a SiC substrate, a GaAs substrate and a GaP substrate. Alternatively, it is further possible to use a substrate including a GaN-based semiconductor layer grown on any of those substrates, or a thick substrate of GaN-based semiconductor obtained by growing a GaN-based semiconductor layer on any of the substrates and removing that substrate. The effect of the present invention is prominent when the substrate does not absorb the light from the laser.

The distinctive feature(s) of each embodiment of the present invention may of course be combined with any feature(s) of another embodiment. The possible combinations may include: forming an anti-reflection film on the chip-division surface of the first embodiment; introducing surface roughness to one side of the mesa side surfaces and shifting the other side off the stripe direction; shifting the mesa side surface off the stripe direction and roughening the chip-division surface; and forming the mesa side surface at an angle to a plane perpendicular to the active layer and setting the chip-division line at an angle to the stripe direction. These modifications are also within the scope of the present invention.

Further, the conductivity types of the respective semiconductor layers constituting the laser structure may be reversed in each of the above-described embodiments.

INDUSTRIAL APPLICABILITY

As described above, according to the present invention, it is possible to provide a GaN-based laser device reduced in noise.

The invention claimed is:

1. A GaN-based laser device having a GaN-based semiconductor stacked-layered structure including a light emitting layer,
wherein said semiconductor stacked-layered structure includes a stripe-shaped waveguide formed therein, has two side surfaces opposite to each other to sandwich said stripe-shaped waveguide in its width direction with no contact therebetween and has two end faces each perpendicularly intersecting with a longitudinal axis of said stripe-shaped waveguide, an entire area of at least one of said two side surfaces is tilted with respect to said longitudinal axis of said stripe-shaped waveguide so that said at least one of the two side surfaces is not parallel to said longitudinal axis, said two side surfaces are non-parallel to each other such that a distance in the width direction between said two side surfaces decreases along said longitudinal axis, and in plan view of the laser device one end of the light emitting layer lies on one of the two side surfaces and another end of the light emitting layer lies on another of the two side surfaces.

2. The GaN-based laser device according to claim 1, wherein an angle of said tilt is within a range of more than 3 degrees and less than 25 degrees.

3. The GaN-based laser device according to claim 2, wherein the angle of said tilt is within a range of more than 10 degrees and less than 20 degrees.

* * * * *